United States Patent
Nagasawa et al.

[11] Patent Number: 6,143,679
[45] Date of Patent: Nov. 7, 2000

[54] LAYERED CRYSTAL STRUCTURE OXIDE

[75] Inventors: Naomi Nagasawa; Akio Machida; Takaaki Ami; Masayuki Suzuki, all of Kanagawa, Japan

[73] Assignee: Sony Corporation, Tokyo, Japan

[21] Appl. No.: 08/943,791

[22] Filed: Oct. 3, 1997

[30] Foreign Application Priority Data

Oct. 6, 1996 [JP] Japan .................................. 8-283072
Apr. 9, 1997 [JP] Japan .................................. 9-106650

[51] Int. Cl.⁷ .............................. C04B 35/01; C04B 35/50
[52] U.S. Cl. ........................... 501/134; 501/123; 423/596
[58] Field of Search ............................ 501/94, 123, 134; 257/295; 365/109; 423/593

[56] References Cited

U.S. PATENT DOCUMENTS

| | | | |
|---|---|---|---|
| 3,847,829 | 11/1974 | Bouchard | 252/63.5 |
| 5,340,796 | 8/1994 | Cava et al. | 505/12 |
| 5,565,414 | 10/1996 | Akimitsu et al. | 505/121 |
| 5,885,648 | 3/1999 | Dougherty et al. | 427/8 |

OTHER PUBLICATIONS

Rentschler "Substitution of lead into the bismuth oxide layers of the n=2 & n=3 Aurivillius phases" *mat Res. Bull*, vol. 32, No. 3, pp. 351–369, Mar. 1997.

*Primary Examiner*—Mark Kopec
*Attorney, Agent, or Firm*—Hill & Simpson

[57] ABSTRACT

Provided are a layered crystal structure oxide showing ferroelectricity or paraelectricity and a process for easily producing the same. A raw material containing $Bi_2O_3$ as a flux is heated up to 1330° C. or higher and 1450° C. or lower at a suitable temperature-elevating rate (heating step); the raw material is maintained at this heating temperature for prescribed time (constant temperature step); and then, it is slowly cooled down to 800° C. or higher and 1300° C. or lower at a rate of 1° C./hour or more and 20° C./hour or less (slow cooling step). This makes it possible to evaporate the flux and take out directly $Bi_2SrTa_2O_9$. In this $Bi_2SrTa_2O_9$, Bi is partially substituted with Sr, and oxygen is selectively deficient or disordered. Or, Bi and O in the fluorite layer are relatively displaced each other in the polarization direction.

22 Claims, 23 Drawing Sheets

- Bi (,Sr)
- Sr (,Bi)
- Ta
- O

● Bi ( ,Sr )
◉ O ; FULLY-OCCUPIED
◈ O ; FULLY-OCCUPIED

- Bi ( ,Sr )
- O ; PARTIALLY-DEFICIENT
- O ; HALF-FILLED

○ Sr ( ,Bi )
● Ta
◉ O ; FULLY-OCCUPIED
◎ O ; FULLY-OCCUPIED c → b

○ Sr ( ,Bi)
● Ta
◐ O ; FULLY-OCCUPIED
◐◐ } O ; FULLY-OCCUPIED

B
O

A
B
O

LAYERED CRYSTAL STRUCTURE OXIDE

BACKGROUND OF THE INVENTION

1. Field of the Invention

The present invention relates to a layered crystal structure oxide such as a so-called Aurivillius crystallographic group and a superconducting material and a process for producing the same.

2. Description of the Related Art

Bismuth layered crystal structure oxides form an industrially very important compound group such as bismuth superconducting oxides having a critical temperature of 110° K and bismuth layered ferroelectric materials which are recently spotlighted as materials for ferroelectric non-volatile memories (FeRAM) (C. A. Paz de Araujo, J. D. Cuchiaro, L. D. McMillan, M. C. Scott and J. F. Scott, Nature, 374 (1995) 627.; K. Amanuma, T. Hase and Y. Miyasaka, Appl. Phys. Lett., 66 (1995) 221.; S. B. Desu and D. P. Vijay, Master. Sci. and Eng., B32 (1995) 75 and the like). In particular, bismuth.strontium.tantalate: $Bi_2SrTa_2O_9$ (hereinafter called BiSTa) is shown to be excellent in fatigue endurance following polarization inversion and capable of driving at a low voltage and is considered to be the most promising candidate for a capacitor material for FeRAM (C. A. Paz de Araujo, J. D. Cuchiaro, M. C. Scott and L. D. McMillan, International Patent Publication No. WO 93/12542 (Jun. 24, 1993)).

In recent years, it is reported that BiSTa has successfully been prepared by an MOCVD process (metal organic chemical vapor deposition) (T. Ami, K. Hironaka, C. Isobe, N. Nagel, M. Sugiyama, Y. Ikeda, K. Watanabe, A. Machida, K. Miura and M. Tanaka, Mater. Res. Soc. Symp. Proc., 415 (1996) 195.; T. Li, Y. Zhu, S. B. Desu, C, H. Peng and M. Nagata, Appl. Phys. Lett., 68 (1996) 616.).

Meanwhile, a number of arguments on the relation of a composition of BiSTa with a ferroelectricity thereof have so far been made, and it is reported that the most excellent ferroelectricity can be obtained in a composition in which bismuth is a little excessive and strontium is slightly deficient, typically in the vicinity of $Bi_{2.2}Sr_{0.8}Ta_2O_9$ (T. Noguchi, T. Hase and Y. Miyasaka, Jpn. J. Appl. Phys., 34, 4900 (1996) and the like). Thus, it is presumed that the partial substitution of bismuth with strontium may be caused in this optimum composition.

However, a great part of these arguments on the compositions is made based on the compositions of the starting materials. Or, also in different cases, the arguments are made based on a polycrystal thin film in which a by-produced phase can be present in a grain boundary and others, and therefore a problem is present in terms of data accuracy. It is reported, for example, that while a single phase has been observed by X-ray analysis, the presence of an amorphous phase has been confirmed by observation with a high resolution transmission electron microscope (TEM) (C. D. Gutleben, Y. Ikeda, C. Isobe, A. Machida, T. Ami, K. Hironaka and E. Morita, Mater. Res. Soc. Symp. Proc., 415 (1996) 201.). Accordingly, it is completely indistinct as well if the partial substitution of the elements is caused.

Further, considering this from the viewpoint of a crystal structure, this BiSTa is called a so-called Aurivillius crystallographic group, and the fundamental crystal structure (host structure; space group I4/mmm or F4/mmm) of $Bi_2SrTa_2O_9$ is as shown in FIG. 1. In this connection, the Aurivillius crystallographic group is represented by the composition formula of $[Bi_2O_2]^{2+}[Me_{m-1}R_mO_{3m+1}]^{2-}$, wherein m is an integer of 2 or more; Me is at least one selected from the group consisting of sodium (Na), potassium (K), calcium (Ca), barium (Ba), strontium (Sr), lead (Pb) and bismuth (Bi); and R is at least one selected from the group consisting of iron (Fe), titanium (Ti), vanadium (V), niobium (Nb), tantalum (Ta) and tungsten (W).

As shown in FIG. 1, BiSTa can be considered to have a structure in which a layer (perovskite layer) comprising two unit lattices of a perovskite structure ($ABO_3$) where strontium is an A site and tantalum is a B site is interposed between layers (fluorite layers) of a fluorite structure composed of bismuth and oxygen. In general, it is considered that out of the above layers, the perovskite layer is responsible for ferroelectricity, and the fluorite layer has a function to maintain the crystal structure. Incidentally, bismuth of the A site in the boundary of the perovskite layer is shared with the fluorite layer.

However, researches on the production process by the MOCVD method have made it clear that this substance has a large non-stoichiometric property and can be formed by using a metastable fluorite phase shown in FIG. 25 as a crystal nucleus and subjecting this to heat treatment (T. Ami, K. Hironaka, C. Isobe, N. Nagel, M. Sugiyama, Y. Ikeda, K. Watanabe, A. Machida, K. Miura and M. Tanaka, Mater. Res. Soc. Symp. Proc., 415 (1996) 195.). Further, it has been confirmed in different researches that also when the crystallinity of a fluorite phase is reduced by lowering the temperatures in the producing process to form the precursor thereof rather close to amorphous one, the layered crystal structure described above is formed through this fluorite phase in a subsequent heat treatment process (C. Isobe et al., 9th Int'l Symp. on Integrated Ferroelectrics Abstr. & Program, 79i). In this case, only one metal site is present in the fluorite phase, and therefore all metal elements of bismuth, strontium and tantalum are considered to occupy an equivalent site over the broad composition range.

In the fluorite phase, a considerably large amount of alkaline earth metals and others can be added to a zirconium (Zr) site in partially stabilized zirconia to form a solid solution. Further, as can be seen from the fact that an oxygen excess type non-stoichiometric compound can be formed in uranium oxide, a non-stoichiometric property is present. As a matter of course, the presence of such non-stoichiometric property applies to deficiency, and both cations and anions can have a large deficiency density. In fact, eight anions have to ideally coordinate around a cation in this fluorite structure, but there is an example in which a coordination number of oxygen is decreased to about 6, by oxygen deficiency while maintaining this structure, as is the case with $\delta\text{-}Bi_2O_3$ (ICPDS, 16-654; $\delta\text{-}Bi_2O_3$; Gattow and Schroder, Z. Anorg. Allgem. Chem. 318 (1962), 176). In this case, out of oxygen atoms forming a regular hexahedron by 8 coordination, two oxygen atoms disposed diagonally to each other are selectively deficient, and the remaining oxygen atoms form a distorted octahedron around bismuth. Because of such property, the fluorite phase is tolerant to lattice distortion and uneven distortion in crystal. Typically, the symmetrical property is lowered in a regular tetrahedron through monoclinic system at room temperatures by lattice distortion in zirconia, and oxygens take 7 coordination. It is not rare that a half band width of X-ray diffraction peaks by $\theta\text{-}2\theta$ scanning comes up to several degrees or more by uneven distortion.

On the other hand, some non-stoichiometric property is present, though not so much as the fluorite phase, as well in the perovskite phase shown in FIG. 26. Examples of the non-stoichiometric property at the A site include various ones such as oxide superconducting materials, for example, those obtained by adding barium, strontium and potassium to a lanthanum site of $La_2CuO_4$. Examples of the non-stoichiometric property at the B site include those obtained by adding lead to a bismuth site of $BaBiO_3$.

Thus, from the viewpoint of a forming mechanism, this material can be defined by [structure in which metal atoms are regularized from the metastable fluorite phase having a large non-stoichiometric property by heat treatment]. However, considering that a part of the fluorite structure is left as well in the structure itself and a non-stoichiometric property is present in a perovskite portion to some extent, it is difficult to expect that this regularization goes on always in a perfect manner. It is so much the more when a deviation in the composition is present.

Accordingly, single crystal as a sample is very important for discussing such composition and crystal chemical side view. With respect to single crystal in the Aurivillius crystallographic group, there have been made researches on $Bi_4Ti_3O_{12}$ (m=3; Me=Bi; R=Ti) (J. F. Dorian, R. E. Newnham, D. K. Smith and M. I. Kay, Ferroelectrics, 3 (1971) 17 and the like) and in recent years, on $Bi_4BaTi_4O_{15}$ (m=4; Me=Bi; R=Ti) (S. K. Kim, M. Miyayama and H. Yanagida, J. Ceram. Soc. Japan, 102 (1994) 722 and the like). However, reliable report examples on BiSTa are very few (R. E. Newnham, R. W. Olfe, R. S. Horsey, F. A. Diaz-Colon and M. I. Kay, Mater. Res. Bull., 8 (1973) 1183.; A. D. Rae, J. G. Thompson and R. L. Withers, Acta. Cryst., B48 (1992) 418.). In addition, out of two papers on BiSTa, the paper reported by Newnham is lacking in accuracy in handling the compositions. Meanwhile, in the paper reported by Rae, tabular single crystal is obtained only in a two phase-mixing state while starting in a fixed ratio composition, and a single phase has not come to be synthesized. Further, the characteristics of the resulting single crystals have scarcely been analyzed in both papers.

That is, it has very important meaning in applying the single crystal of the Aurivillius crystallographic group to FeRAM as a material showing ferroelectricity to prepare the single crystal of the Aurivillius crystallographic group and make a crystal chemical side view thereof clear. Further, it is indicated as well that these Aurivillius crystallographic groups have possibility to show paraelectricity depending on the composition and the crystallinity thereof (M. Machida, N. Nagasawa, T. Ami and M. Suzuki, Applied Physics Society [9p-F-2], No. 57, Autumn 1996), and they have a very important meaning as well in using them as a new DRAM material and applying them to a new laminated device.

It is proposed to apply the self-flux method which is used in preparing high temperature superconducting oxides (refer to Y. Hidaka, Y. Enomoto, M. Suzuki, M. Oda and T. Murakami, J. Cryst. Growth, 85 (1987) 581; and Y. Hidaka, M. Oda, M. Suzuki, Y. maeda, Y. Enomoto and T. Murakami, Jpn. J. Appl. Phys., 27 (1988) L538.) to the preparation of the single crystal of the Aurivillius crystallographic group (M. Suzuki, N. Nagasawa, A. Machida and T. Ami, Jpn. J. Appl. Phys., 35 (1996) L564.). In this connection, the flux method is a method in which a suitable amount of a flux (fusing agent) is added to a raw material to prepare a fused liquid by heating, and then this is cooled down to generate a crystal nucleus to grow crystal. In this flux method, the flux usually remains even after growing the crystal, and the grown crystal has to be separated from the flux to take it out.

However, there have been involved in preparing the Aurivillius crystallographic group by the self-flux method, the problems that when trying to remove the flux by bleaching, it can not be removed because the flux is not dissolved in water and that when trying to remove the flux by etching with acid such as hydrochloric acid (HCl), crystal grown together with the flux is eroded as well, and therefore it is difficult to take out the crystal.

SUMMARY OF THE INVENTION

The present invention has been made in view of such backgrounds and problems, and a first object thereof is to provide a layered crystal structure oxide showing ferroelectricity or paraelectricity.

A second object thereof is to provide a production process for a layered crystal structure oxide, capable of easily producing the layered crystal structure oxide described above.

The layered crystal structure oxide of the present invention comprises bismuth, a first element, a second element and oxygen, wherein the first element is at least one selected from the group consisting of sodium, potassium, calcium, barium, strontium, lead and bismuth; the second element is at least one selected from the group consisting of iron, titanium, vanadium, niobium, tantalum, tungsten and copper; and at least two elements located in different lattices are partially substituted.

The different layered crystal structure oxide of the present invention comprises bismuth, a first element, a second element and oxygen, wherein the first element is at least one selected from the group consisting of sodium, potassium, calcium, barium, strontium, lead and bismuth; the second element is at least one selected from the group consisting of iron, titanium, vanadium, niobium, tantalum, tungsten and copper; and at least one element is partially deficient or disordered.

The still different layered crystal structure oxide of the present invention comprises bismuth, a first element, a second element and oxygen, wherein the first element is at least one selected from the group consisting of sodium, potassium, calcium, barium, strontium, lead and bismuth; the second element is at least one selected from the group consisting of iron, titanium, vanadium, niobium, tantalum, tungsten and copper; and a cation and an anion in a fluorite layer are relatively displaced each other by 3% or more of a unit lattice length in a polarization axis direction.

In the production process for the layered crystal structure oxide of the present invention, the layered crystal structure oxide is produced using the self flux method, wherein a raw material containing a flux is heated up to temperatures higher than the melting point of the raw material and then maintained at temperatures higher than the melting point for fixed time, whereby the flux is evaporated to such an extent that the layered crystal structure oxide can be taken out to produce the layered crystal structure oxide.

In the layered crystal structure oxide of the present invention, at least two elements located in different lattices are partially substituted. Further, in the different layered crystal structure oxide of the present invention, at least one element is partially deficient or disordered. In the still different layered crystal structure oxide of the present invention, a cation and an anion in the fluorite layer are relatively displaced each other by 3% or more of a unit lattice length in a polarization axis direction.

In the production process for the layered crystal structure oxide of the present invention, a flux is added to a raw material to heat the material up to temperatures higher than the melting point thereof, and it is then maintained at temperatures higher than the melting point for fixed time. This allows the flux to be evaporated to such an extent that the layered crystal structure oxide can be taken out and enables to take out the layered crystal structure oxide.

EXPLANATION OF CODES

Figure 1:
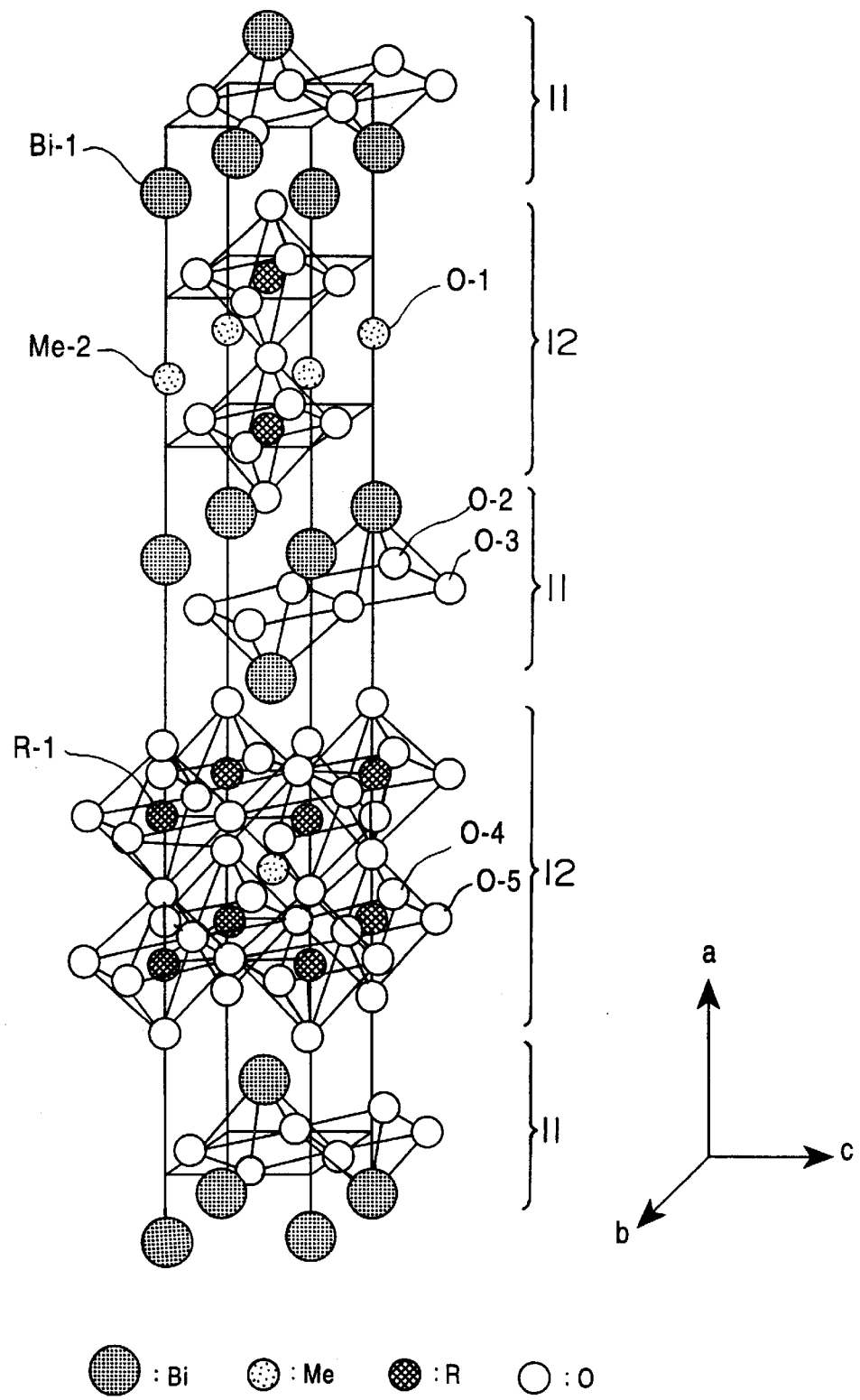
FIG. 1 is a conceptual diagram showing the fundamental crystal structure of the layered crystal structure oxide related to one embodiment of the present invention.

11 Fluorite layer
12 Perovskite layer
20 Double crucible
21 Platinum crucible
22 Alumina crucible
23 Lid
30 Vertical siliconite furnace
31 Core tube
32 Loading table
33 Heater
34 insulating material
35 Lid
M Raw material

DESCRIPTION OF THE PREFERRED EMBODIMENT

The embodiments of the present invention shall be explained below in detail with reference to the drawings.

The layered crystal structure oxide related to the embodiment of the present invention is composed of bismuth, the first element Me, the second element R and oxygen. The first element is at least one selected from the group consisting of sodium, potassium, calcium, barium, strontium, lead and bismuth, and the second element is at least one selected from the group consisting of iron, titanium, vanadium, niobium, tantalum, tungsten and copper. The first element Me is preferably at least one selected from the group consisting of strontium, lead, barium and calcium, and the second element R is preferably at least one selected from the group consisting of niobium and tantalum. The first element Me is more preferably at least one selected from the group consisting of strontium and calcium. In particular, the first element Me is preferably strontium, and the second element is preferably tantalum.

The stoichiometric composition formula of this layered crystal structure oxide is shown in the following composition formula (I). However, the layered crystal structure oxide related to the embodiment of the present invention shall not be restricted to those which meet the stoichiometric composition formula and includes those deviating from the stoichiometric composition:

$$[Bi_2O_2]^{2+}[Me_{m-1}R_mO_{3m+1}]^{2-} \quad (I)$$

Me: first element
R : second element
m : any integer of 2, 3, 4 or 5

Further, the fundamental crystal structure of the layered crystal structure oxide in which m is 2 in the composition formula (I) is shown in FIG. 1. As apparent therefrom, in this layered crystal structure oxide, a fluorite layer 11 corresponding to $[Bi_2O_2]^{2+}$ and a perovskite layer 12 corresponding to $[Me_{m-1}R_mO_{3m+1}]^{2-}$ are superposed one after the other, and it has an anisotropic a axis cleavage property (refer to H. Maeda, Y. Tanaka, M. Fukutomo and T. Asano, Jpn. Appl. Phys., 27 (1988) L209.; K. Hiraga, M. Hirabayashi, M. Kikuchi and Y. Syono, Jpn. Appl. Phys., 27 (1988) L573.).

Though not shown in FIG. 1, in this layered crystal structure oxide, at least two elements located in different lattices are partially substituted in a certain case. In some cases, for example, bismuth, the first element Me and the second element R are partially substituted respectively with each other, and bismuth and the first element Me are partially substituted with each other.

In addition, though similarly not shown in FIG. 1, in this layered crystal structure oxide, at least one element is partially deficient or disordered in a certain case. In some cases, for example, oxygens constituting the fluorite layer 11 are selectively deficient or disordered, or peak oxygens located in a boundary between the fluorite layer 11 and the perovskite layer 12 are disordered.

Further, though likewise not shown in FIG. 1, in this layered crystal structure oxide, a cation (that is, bismuth or the first element Me or the second element R substituted at a bismuth site) and an anion (that is, oxygen) in the fluorite layer 11 are relatively displaced each other by 3% or more of a unit lattice length ($C_0 \approx 5.5$ Å) in a polarization axis (c axis) direction in a certain case. Ferroelectricity depends on relative displacement of cations and anions over the whole crystal. Also with respect to the fluorite layer which is not generally considered to contribute so much to the ferroelectricity, it is considered that the larger this relative displacement is, the more preferred. For example, the relative displacement is preferably 5% or more, more preferably 7% or more.

In addition, this layered crystal structure oxide includes one showing paraelectricity and one showing ferroelectricity in a c axis direction. This seems to be because different properties come out depending on a difference in the crystallinity, the partial substitution of the elements, the partial deficiency and the displacement.

As described above, according to the layered crystal structure oxide related to the embodiment of the present invention, the substance showing ferroelectricity or paraelectricity can readily be obtained as compared with complete crystal because at least two elements located in different lattices are partially substituted or at least one element is partially deficient or disordered. Accordingly, the substance showing ferroelectricity can easily be applied to FeRAM, and the substance showing paraelectricity can be used as a new substance showing paraelectricity for an auxiliary agent in forming a capacitor and a capacitor material for DRAM.

Further, according to the layered crystal structure oxide related to the embodiment of the present invention, a cation and an anion in the fluorite layer 11 are relatively displaced each other by 3% or more of a unit lattice length in a polarization axis direction, and the substance showing ferroelectricity can be obtained. Accordingly, it can be applied to FeRAM and the like.

The layered crystal structure oxides having such structures can be produced in the following manner. The production process for the layered crystal structure oxide of the present invention shall be explained together here.

First of all, suitable oxide raw materials are blended in suitable proportions. When the layered crystal structure oxide having a stoichiometric composition formula of, for example, $Bi_2Sr_1Ta_2O_9$ is produced, bismuth oxide ($Bi_2O_3$), strontium carbonate ($SrCO_3$) and tantalum oxide ($Ta_2O_5$) are prepared respectively to blend them in a mole ratio of bismuth oxide 45 to 80, strontium carbonate 10 to 15 and tantalum oxide 10 to 15, preferably bismuth oxide 46.6 to 79.0, strontium carbonate 10.5 to 14.3 and tantalum oxide 10.5 to 14.3, and most preferably bismuth oxide 79.0, strontium carbonate 10.5 and tantalum oxide 10.5.

Bismuth oxide is used as a flux here, and therefore the mole ratio of bismuth oxide has been raised. Thus, when the layered crystal structure oxide containing bismuth is produced, bismuth oxide is particularly preferably used as a flux.

Then, the raw material containing bismuth oxide as a flux is put into a suitable crucible, and the crucible is put into a suitable furnace to subject the raw material to heat treatment.

Figure 2:
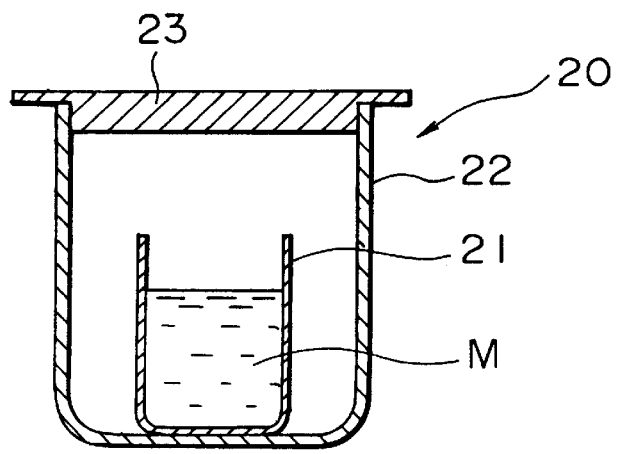
FIG. 2 is a structural drawing showing a double crucible used in producing the layered crystal structure oxide shown in FIG. 1.

FIG. 2 shows the structure of a double crucible 20 used in the embodiment of the present invention. This double crucible 20 is equipped with a platinum crucible 21 for putting a raw material M and an alumina crucible 22 for putting this platinum crucible 21. Further, a lid 23 of alumina is put on the alumina crucible 22. Thus, the double crucible 20 is used to melt the raw material M in order to control the evaporation of a bismuth compound.

Figure 3:
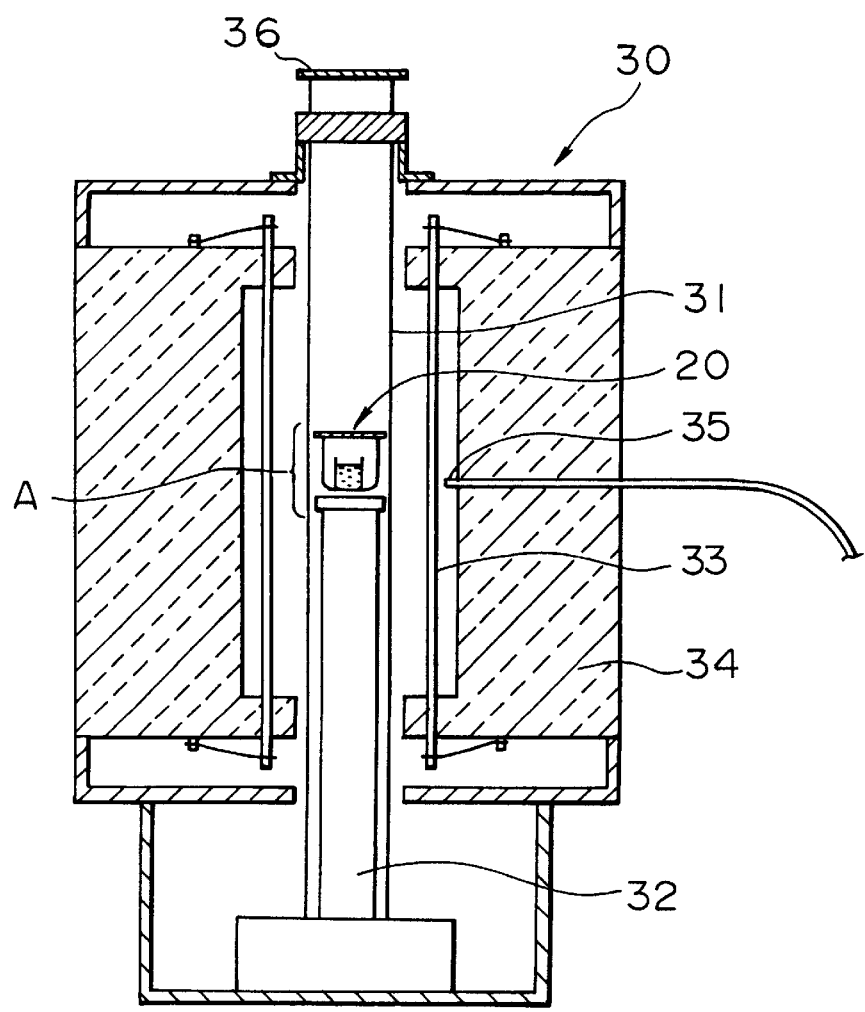
FIG. 3 is a structural drawing showing a vertical siliconite furnace used in producing the layered crystal structure oxide shown in FIG. 1.

FIG. 3 shows the structure of a vertical siliconite furnace 30 used in the embodiment of the present invention. This vertical siliconite furnace 30 is equipped with a core tube 31 which is vertically disposed, and the double crucible 20 placed on a loading table 32 is inserted almost in the center of this core tube 31. This core tube 31 is made of, for example, alumina ($Al_2O_3$) or mullite.

A heater 33 is disposed in the circumference of the core tube 31, and the circumference thereof is covered with an insulating material 34. Thus, a soaking part A is formed in the vicinity of the double crucible 20. The temperature of this soaking part A can be measured by a thermo couple 35 disposed in the vicinity of the soaking part A. The volume of the core tube 31 in this soaking part A is 5 to 30 times as large as the volume of the double crucible 20. This volume ratio is important in controlling the evaporation of a bismuth compound.

A lid 36 is disposed at the upper part of the core tube 31, and an unillustrated forced exhaust unit for exhausting the bismuth compound is disposed in the vicinity thereof. That is, the core tube 31 has a function as an exhaust path for introducing the evaporated bismuth compound into the unillustrated forced exhaust unit while preventing the evaporated bismuth compound from sticking to the heater 33.

Figure 4:
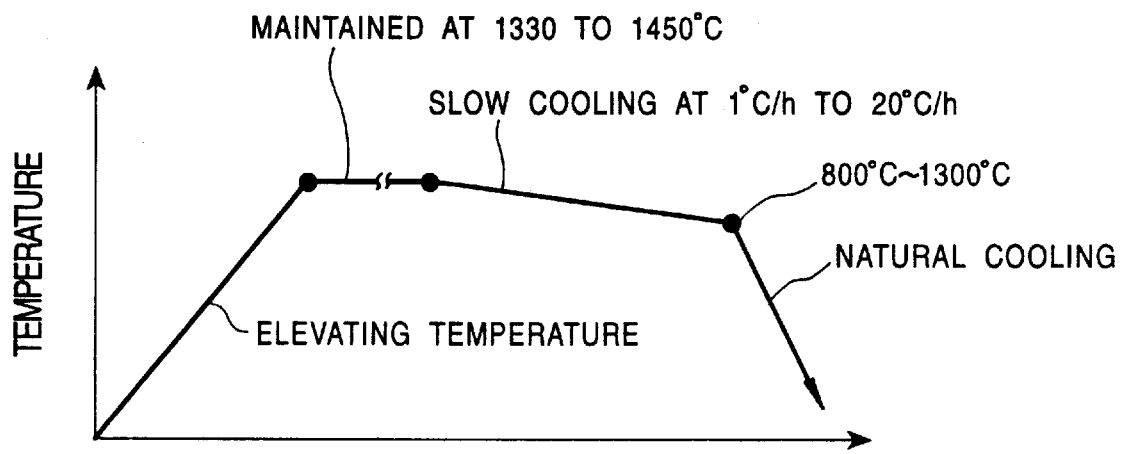
FIG. 4 is a chart showing a temperature condition in heat treatment carried out in producing the layered crystal structure oxide shown in FIG. 1.

FIG. 4 shows temperature conditions in carrying out heat treatment in this vertical siliconite furnace 30. Thus, in the embodiment of the present invention, the raw material M is first heated up to temperatures higher than the melting point (for example, 1330° C. or higher and 1450° C. or lower) at a suitable temperature-elevating rate (heating step) and then maintained at this heating temperature for prescribed time (constant temperature step). Subsequently, it is slowly cooled down to, for example, 800° C. or higher and 1300° C. or lower at a rate slower than natural cooling (for example, 1° C./hour or more and 20° C./hour or less) (slow cooling step). That is, this allows the raw material containing bismuth oxide as a flux to be maintained at temperatures higher than the melting point for prescribed time to evaporate substantially the whole flux. Then, the raw material is cooled down to room temperatures by natural cooling (natural cooling step). In the example shown in FIG. 4, the raw material is heated up to the melting point 1330° C. of bismuth oxide or higher at the heating step.

Further, several preferred specific examples of this heat treatment shall be explained. For example, the raw material M is heated to 1350° C. or higher and 1450° C. or lower at a suitable temperature-elevating rate (heating step) and then maintained at this heating temperature for a time of longer than one hour and shorter than 3 hours (constant temperature step). Subsequently, it is slowly cooled down to temperatures of 800° C. or higher and 1300° C. or lower at a slow cooling rate of 1° C./hour or more and 5° C./hour or less (slow cooling step). Then, the raw material is cooled down to room temperatures by natural cooling (natural cooling step).

Or, for example, the raw material M is heated to 1350° C. or higher and 1450° C. or lower at a suitable temperature-elevating rate (heating step) and then maintained at this heating temperature for a time of longer than 10 hours and shorter than 40 hours (constant temperature step). Subsequently, it is slowly cooled down to temperatures of, for example, 800° C. or higher and 1300° C. or lower at a slow cooling rate of 5° C./hour or more and 20° C./hour or less (slow cooling step). Then, the raw material is cooled down to room temperatures by natural cooling (natural cooling step).

Or, for example, the raw material M is heated to 1330° C. or higher and 1370° C. or lower at a suitable temperature-elevating rate (heating step) and then maintained at this heating temperature for a time of longer than 40 hours and shorter than 50 hours (constant temperature step). Subsequently, it is slowly cooled down to temperatures of, for example, 800° C. or higher and 1300° C. or lower at a slow cooling rate of 1° C./hour or more and 5° C./hour or less (slow cooling step). Then, the raw material is cooled down to room temperatures by natural cooling (natural cooling step).

An impurity layer shall be formed here if the maintained time is too long or too short at the constant temperature step. When the layered crystal structure oxide having a stoichiometric composition formula of, for example, $Bi_2Sr_1Ta_2O_9$ is produced, the impurity layers of $SrTa_4O_{11}$ (JCPDS No. 16-708) and $Sr_2Ta_2O_7$ (JCPDS No. 30-1304) are formed if the maintained time is too long at the constant temperature step, and the impurity layer of β-$Bi_2O_3$ (JCPDS No. 18-224) or α-$Bi_2O_3$ (JCPDS No. 27-53) or δ-$Bi_2O_3$ (JCPDS No. 27-52) is formed if the maintained time is too short. Pure single crystal is colorless and transparent, but if the impurity layer of $SrTa_4O_{11}$ is formed, the crystal turns white, and if the impurity layer of β-$Bi_2O_3$ or α-$Bi_2O_3$ is formed, the crystal becomes pale yellow.

This allows the layered crystal structure oxide to be produced and substantially the whole flux to be evaporated and makes it possible to take out the layered crystal structure oxide. The layered crystal structure oxide obtained by the process related to the embodiment of the present invention is represented primarily by the following formula (II):

$$Bi_{2-a}Sr_{1+b}Ta_2O_{9+c} \qquad (II)$$

wherein $0 \leq a \leq 0.14$, $0 \leq b \leq 0.35$ and $-0.21 \leq c \leq 0.35$.

In this connection, according to this self-flux method, heating at high temperatures of about 1300° C. or higher is required unlike a two stage calcining method proposed by Subbarao (E. C. Subbarao, Phys. Solids., 23 (1962) 665.), but single crystal thin film flakes can be obtained in large quantities. In the self-flux method, a substance constituting a part of crystal to be grown is used as a flux (fusing agent).

Thus, according to the production process for the layered crystal structure oxide related to the embodiment of the present invention, the raw material M containing the flux is maintained at temperatures of the melting point or higher for prescribed time to thereby evaporate substantially the whole flux, and therefore the grown layered crystal structure oxide can directly be taken out. Accordingly, an after step for taking out the layered crystal structure oxide is not required, and the layered crystal structure oxide can be prevented from being eroded by etching with acid. Further, since a decrease in the flux results in an increase in the melting point, time required for the slow cooling step can be shortened, and therefore the layered crystal structure oxide can efficiently be produced.

EXAMPLES

Further, the specific examples of the present invention shall be explained in detail with reference to the drawings. In the following examples, the layered crystal structure oxide having a stoichiometric composition formula of $Bi_2Sr_1Ta_2O_9$ shall specifically be explained.

Example 1

The layered crystal structure oxide capable of being produced by the production process related to the embodiment of the present invention and the conditions thereof shall specifically be explained here.

First, bismuth oxide, strontium carbonate and tantalum oxide (all are guaranteed reagents manufactured by Kojundo Chemical Laboratory Co., Ltd.) were prepared as raw materials respectively to blend them in a mole ratio of bismuth oxide 79.0, strontium carbonate 10.5 and tantalum oxide 10.5. That is, bismuth oxide was used as a flux here.

Figure 5:
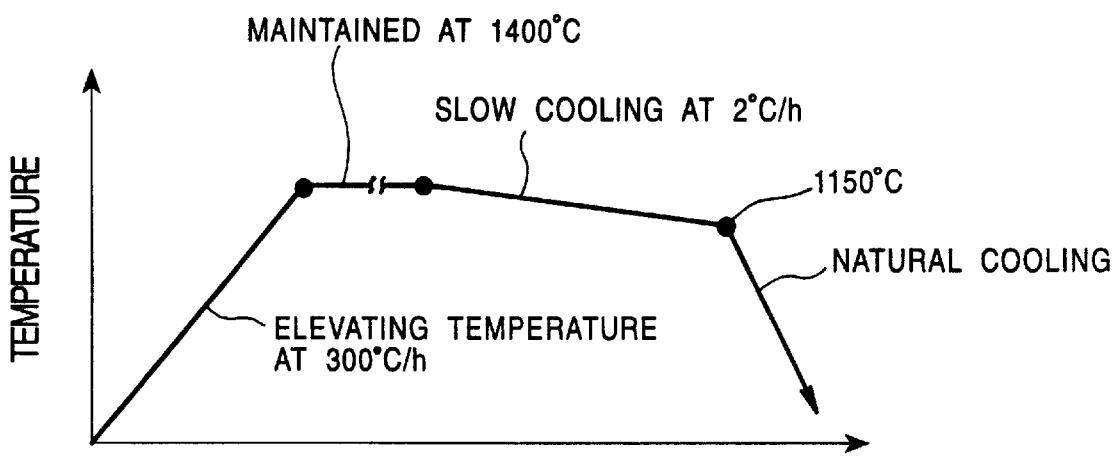
FIG. 5 is a chart showing a temperature condition in heat treatment carried out in Example 1 of the present invention.

Then, the double crucible 20 shown in FIG. 2 was prepared, and the mixed raw material M was put into the inner platinum crucible 21. It was put into the outer alumina crucible 22, and the lid 23 was put thereon. Subsequently, this double crucible 20 was inserted into the vertical siliconite furnace 30 shown in FIG. 3, and heat treatment was carried out on the temperature condition shown in FIG. 5. That is, the raw material M was heated up to 1400° C. at a temperature-elevating rate of 300° C./hour (heating step) and maintained at 1400° C. for one hour or longer (constant temperature step). Subsequently, it was slowly cooled down to 1150° C. at a slow cooling rate of 2° C./hour (slow cooling step) and then cooled down to room temperatures. In this case, the maintained time at the constant temperature step was varied to one hour, 2 hours and 3 hours respectively.

This allowed the flux to be completely evaporated in the raw material obtained at any maintained time, and only grown crystal remained in the platinum crucible 21. The resulting crystal obtained at a maintained time of one hour had a yellow color; one obtained at a maintained time of 2 hours was colorless and transparent; and one obtained at a maintained time of 3 hours had a white color. The respective crystals were as large as 3 mm×4 mm×5 μm in the largest dimensions.

Figure 6:
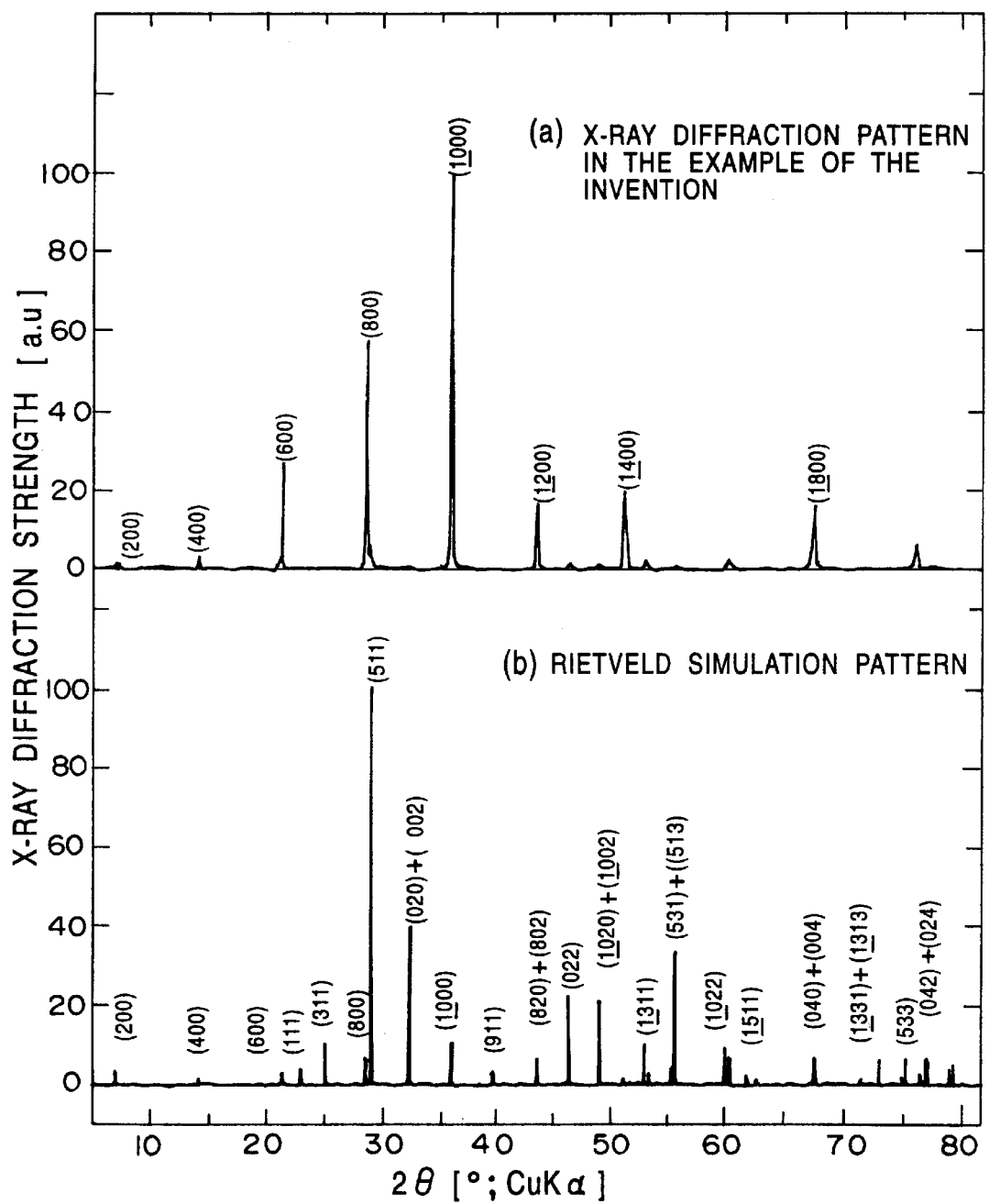
FIG. 6 is an X-ray diffraction pattern diagram (a) showing the composition of one crystal obtained in the temperature condition shown in FIG. 5 and shown together with a Rietveld simulation pattern.
Figure 7:
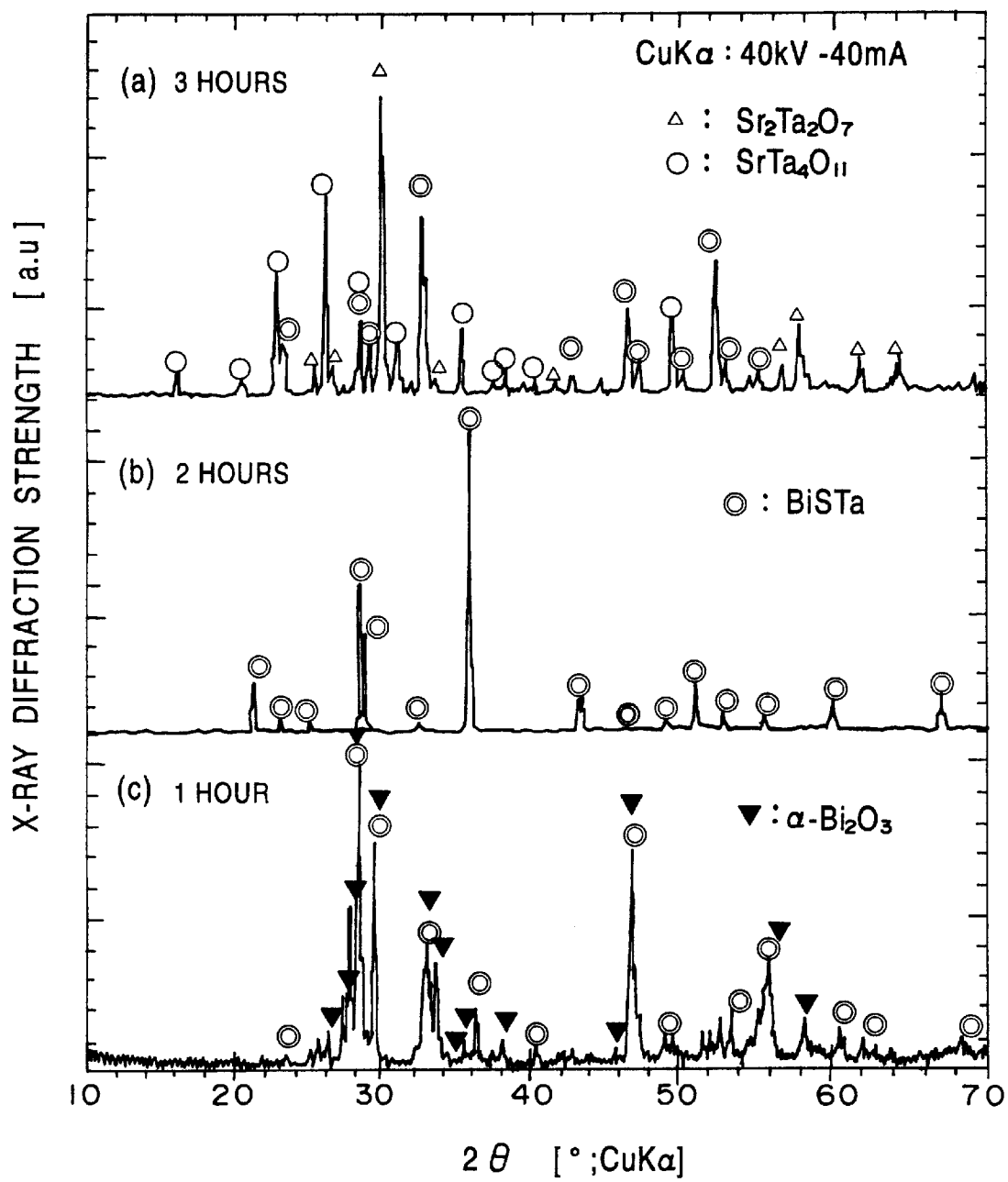
FIG. 7 is an X-ray diffraction pattern diagram for explaining a difference in the composition of crystal obtained at a maintained time of a constant temperature step in the temperature condition shown in FIG. 5.

These crystals each were subjected to identification analysis by X-ray diffraction. The results thereof are shown in FIG. 6 and FIG. 7. The X-ray diffraction pattern (XRDP) of the crystal obtained at a maintained time of 2 hours is shown in FIG. 6 together with a reference pattern for comparison with this XRDP. The XRDPs of the respective crystals obtained by varying the maintained time are shown in FIG. 7 respectively. The reference pattern was determined from a Rietveld simulation pattern based on the lattice constants determined by Rae et al. (a=2.49839 nm, b=0.55344, c=0.55306 nm; A. D. Rae, J. G. Thompson and R. L. Withers, Acta. Cryst., B48 (1992) 418.). With respect to the space group, "Fmm" having a higher symmetry was used.

As shown in FIG. 6, it was confirmed that the crystal obtained at a maintained time of 2 hours was a layered crystal structure oxide comprising bismuth, strontium, tantalum and oxygen. In contrast with this, as shown in FIG. 7($a$), it was found that the crystal obtained at a maintained time of one hour contained $\alpha$-$Bi_2O_3$ (JCPDS No. 27-53) as an impurity phase, and as shown in FIG. 7($c$), the crystal obtained at a maintained time of 3 hours contained $SrTa_4O_{11}$ (JCPDS No. 16-708) and $Sr_2Ta_2O_7$ (JCPDS No. 30-1304) as impurity phases.

Further, it has been found from the XRDP shown in FIG. 6 that the crystal obtained at a maintained time of 2 hours has a strong a axis orientation originating in the fact that the crystal is flaky. The lattice constants of the a axis and the c axis were determined from the diffraction peaks (022) and (1800) based on the model that this crystal was a regular tetrahedron of b=c to find that the lattice constant of the a axis was 2.498 nm and the lattice constant of the c axis was 0.5528 nm. Since this crystal has an a axis orientation, (001) diffraction and (0k0) diffraction are extremely decreased and overlapped with other peaks at high angles. Accordingly, it is very difficult to determine the lattice constants of the c axis and the b axis together. It is pointed out by Rae et al. that this layered crystal structure oxide corresponds to a space group $A2_1am$ ($Cmc2_1$ according to expression in the embodiment of the present invention) (A. D. Rae, J. G. Thompson and R. L. Withers, Acta. Cryst., B48 (1992) 418.). However, it was impossible to judge whether or not the lattice constant of the c axis was the same as that of the b axis only from the result of this X-ray diffraction.

In addition, the crystal obtained at a maintained time of 2 hours was subjected to (1) observation of the microstructure by means of a scanning electron microscope (SEM), (2) observation of the surface morphology by an atomic force microscope (AFM), (3) observation of Laue spots, (4) chemical analysis by means of an inductively coupled plasma atomic emission spectroscope (ICP-AES) and electron probe microanalysis (EPMA), (5) thermal analysis and (6) observation of ferroelectric hysteresis, respectively. The results thereof are shown below.

(1) Observation Result of Microstructure by SEM

The surface of the flake was observed by means of SEM to find that it was smooth. This is considered to be an a plane brought about by a strong cleavage property.

(2) Observation Result of Surface Morphology by AFM

The surface was observed in a scanning range of 1 mm×1 mm by means of AFM to find that it was smooth. The RMS (root mean square) value thereof was about 0.4 nm. Further, it was found that a step present on the topmost surface had a height of 1.2 to 1.3 nm and corresponded to a half of the lattice constant (about 2.5 nm) of the a axis determined from the result of X-ray diffraction. That is, this step is considered to originate in a strong a plane cleavage property or anisotropic growth.

(3) Observation Result of Laue Spots

Figure 8:
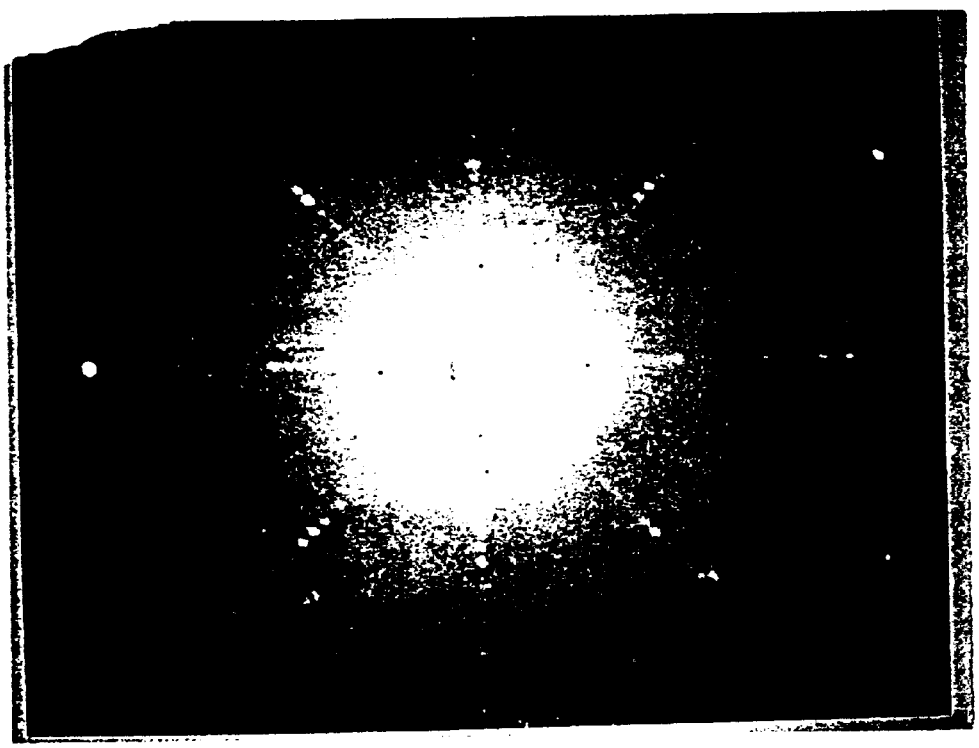
FIG. 8 is a microphotograph showing the Laue spots of the layered crystal structure oxide obtained in the temperature condition shown in FIG. 5.

A microphotograph obtained by observing the Laue spots is shown in FIG. 8. Thus, the Laue spots were observed to find that the resulting crystal was a single crystal.

(4) Result of Chemical Composition Analysis by ICP-AES and EPMA

The analytical results of ICP-AES and EPMA are shown in Table 1. Thus, the composition ratio of bismuth, strontium and tantalum was 1.92:1.10:2.00 according to ICP-AES and 1.87:1.28:2.00 according to EPMA. That is, while the resulting single crystal is considered to have a slight non-stoichiometric property brought about by metal, it is considered to have a composition close fundamentally to a stoichiometric composition. EPMA is analysis carried out by wavelength dispersive X-ray spectroscopy (WDS).

TABLE 1

| ICP-AES | Bi:Sr:Ta = 1.92:1.10:2.00 |
|---|---|
| EPMA (WDS) | Bi:Sr:Ta = 1.87:1.28:2.00 |

(5) Result of Thermal Analysis

Figure 9:
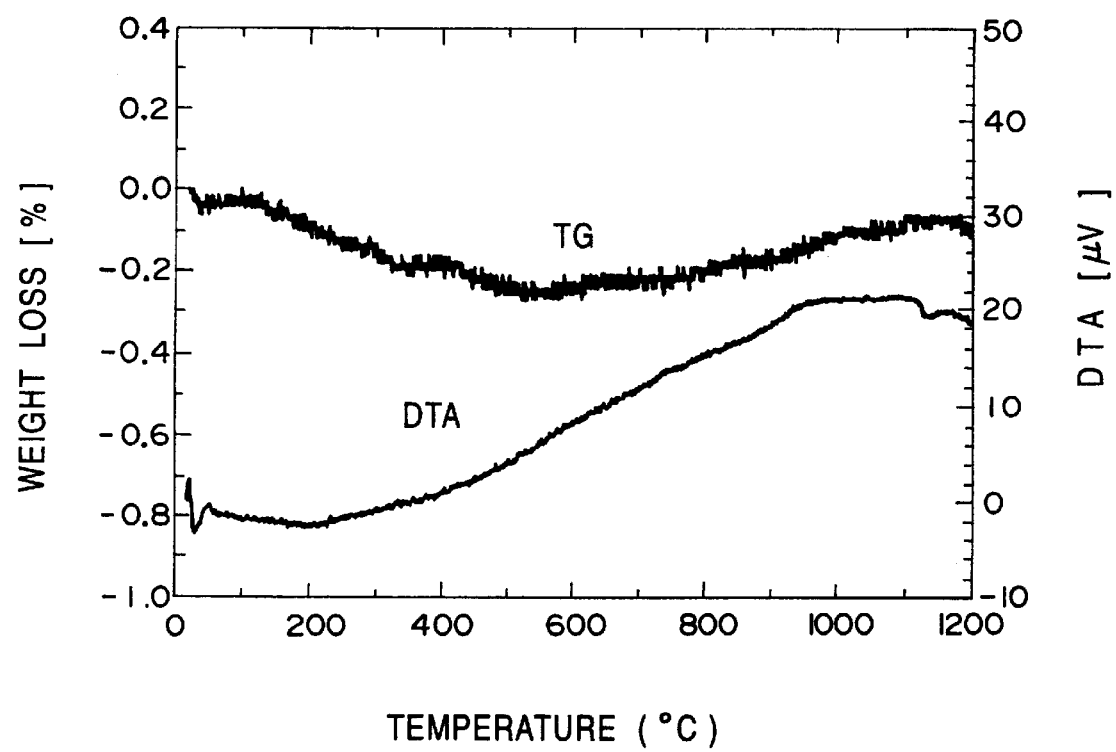
FIG. 9 is a characteristic diagram showing the result of the thermal analysis of the layered crystal structure oxide obtained in the temperature condition shown in FIG. 5.

The result of thermal analysis is shown in FIG. 9. Thus, the thermal gravimetry (TG) was as very small as 3% or less in a wide temperature range. That is, it was found that once the crystal was synthesized at as high temperatures as 1400° C., the evaporation of a bismuth compound and oxygen deficiency scarcely took place in a temperature range up to 1200° C.

(5) Observation Result of Hysteresis

Figure 10:
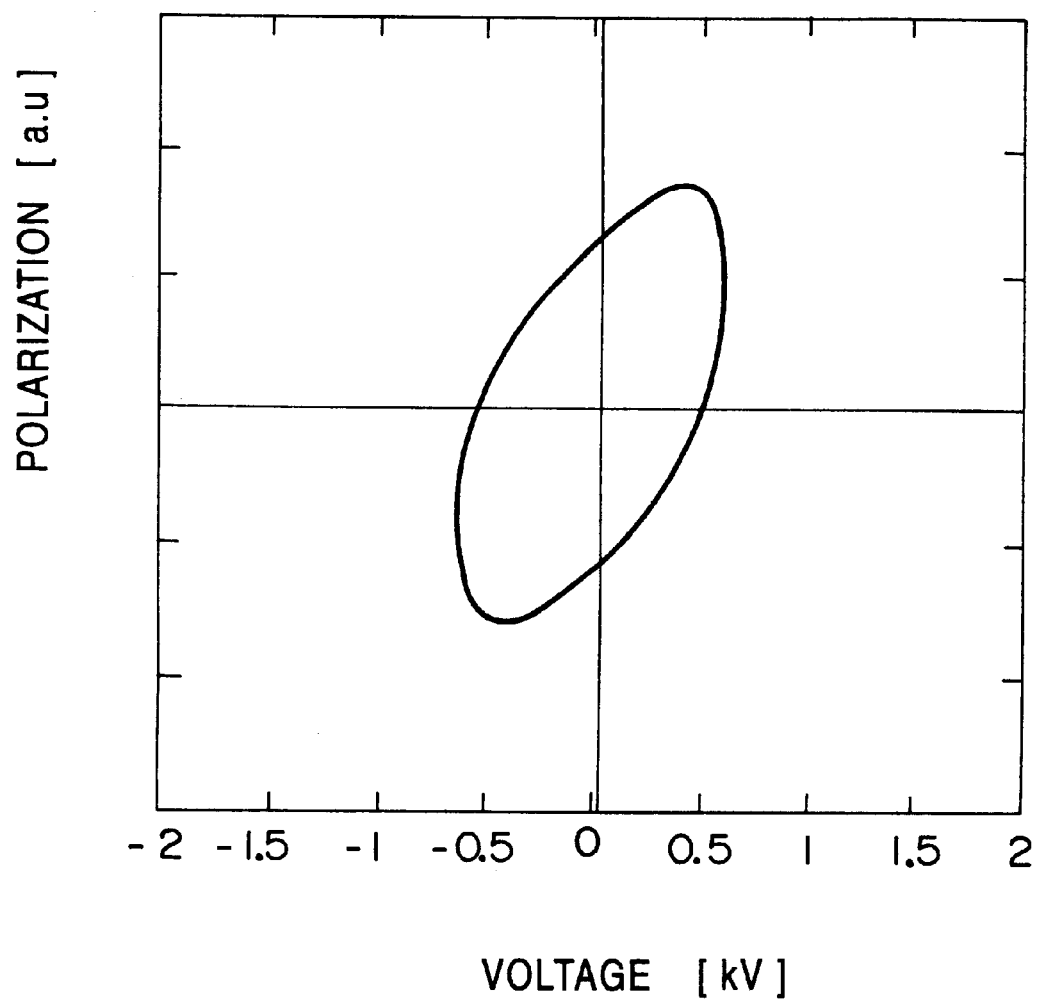
FIG. 10 is a characteristic diagram showing the ferroelectric hysteresis of the layered crystal structure oxide obtained in the temperature condition shown in FIG. 5.

An electrode of platinum (Pt) was deposited on one edge of a crystal piece to observe ferroelectric hysteresis at 200° C. Measurement was carried out at high temperatures because this layered crystal structure oxide had a high anti-electric field, and therefore observation was considered to be difficult at room temperatures. The results thereof are shown in FIG. 10. Thus, ferroelectric hysteresis was observed to find that this layered crystal structure oxide showed ferroelectricity.

Also in the case where after the raw material was heated to 1350° C. or higher and 1450° C. or lower and maintained for a time of longer than one hour and shorter than 3 hours, it was slowly cooled down to 800° C. or higher and 1300° C. or lower at a slow cooling rate of 1° C./hour or more and 5° C./hour or less to grow a layered crystal structure oxide, the same result as that obtained at the maintained time set to 2 hours in Example 1 described above can be obtained.

Figure 11:
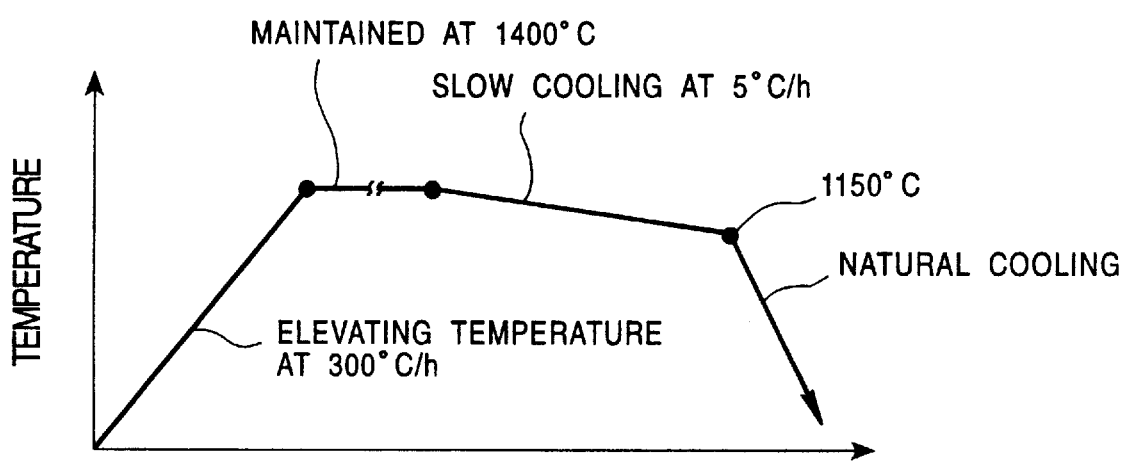
FIG. 11 is a chart showing another temperature condition in heat treatment carried out in Example 1 of the present invention.

In the present example, the same raw materials as used in the previous example were prepared and blended in the same blend ratio as in the previous example. Then, the double crucible 20 (refer to FIG. 2) and the vertical siliconite furnace 30 (refer to FIG. 3) were used to carry out heat treatment on the temperature condition shown in FIG. 11. That is, the raw material was heated up to 1400° C. at a temperature-elevating rate of 300° C./hour (heating step) and maintained at 1400° C. for 10 hours or longer (constant temperature step). Subsequently, it was slowly cooled down to 1150° C. at a slow cooling rate of 5° C./hour (slow cooling step) and then cooled down to room temperatures. In this case, the maintained time at the constant temperature step was varied to 10 hours, 30 hours and 40 hours respectively.

This allowed the flux to be completely evaporated in the raw material obtained at any maintained time, and only grown crystal remained in the platinum crucible 21. The resulting crystal obtained at a maintained time of 10 hours had a yellow color; one obtained at a maintained time of 30 hours was colorless and transparent; and one obtained at a maintained time of 40 hours had a white color. The respective crystals were as large as 3 mm×4 mm×5 μm in the largest dimensions.

Figure 12:
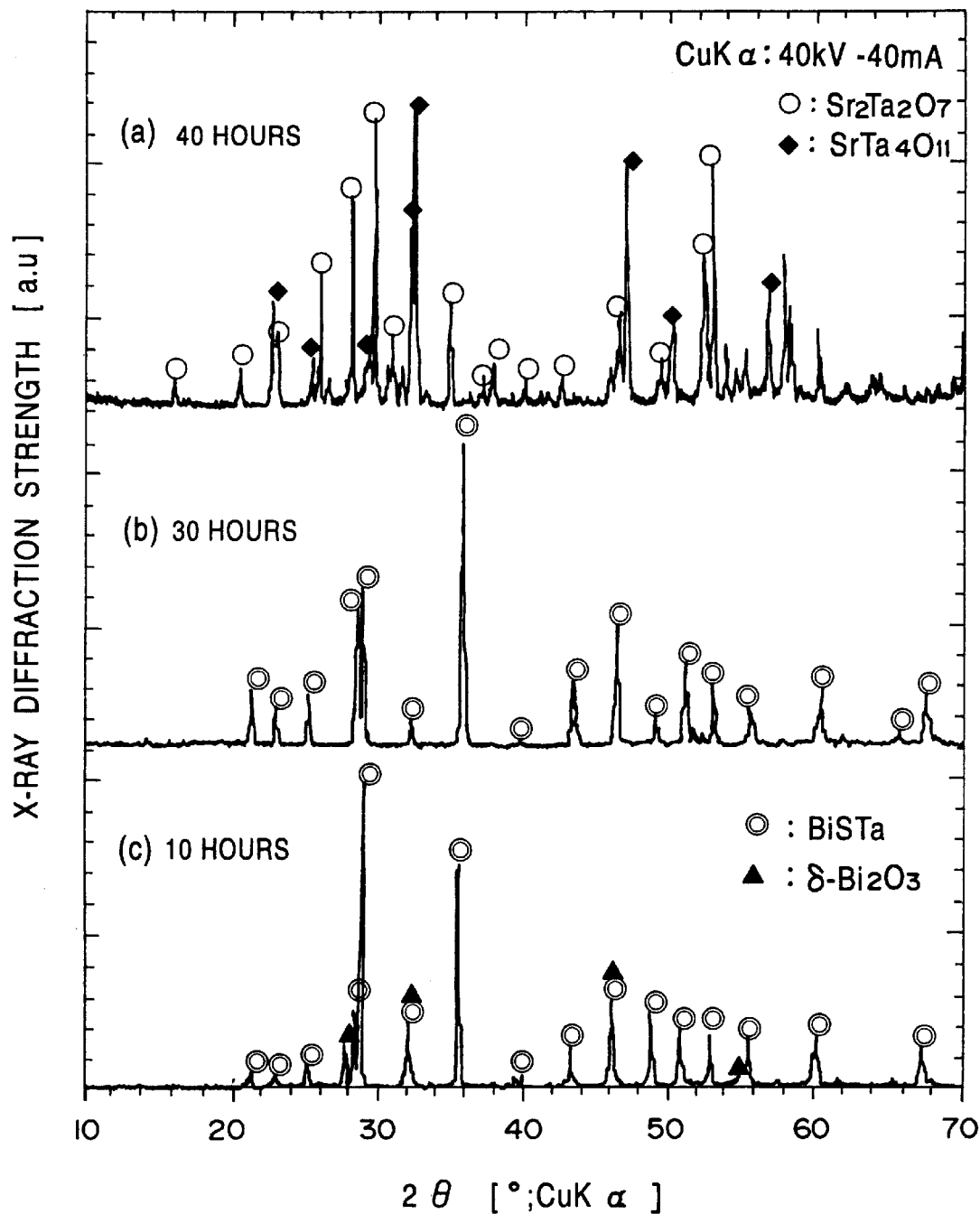
FIG. 12 is an X-ray diffraction pattern diagram for explaining a difference in the composition of crystal obtained at a maintained time of the constant temperature step in the temperature condition shown in FIG. 11.

These crystals each were subjected to identification analysis by X-ray diffraction. The results thereof are shown in FIG. 12. Thus, it was confirmed that the crystal obtained at a maintained time of 30 hours was a layered crystal structure oxide comprising bismuth, strontium, tantalum and oxygen. In contrast with this, it was found that the crystal obtained at a maintained time of 10 hours contained α-$Bi_2O_3$ (JCPDS No. 27-53) as an impurity phase, and the crystal obtained at a maintained time of 40 hours contained $SrTa_4O_{11}$ (JCPDS No. 16-708) and $Sr_2Ta_2O_7$ (JCPDS No. 30-1304) as impurity phases.

Also in the case where after the raw material was heated to 1350° C. or higher and 1450° C. or lower and maintained for a time of longer than 10 hours and shorter than 40 hours, it was slowly cooled down to 800° C. or higher and 1300° C. or lower at a slow cooling rate of 5° C./hour or more and 20° C./hour or less to grow a layered crystal structure oxide, the same results as that obtained at the maintained time set to 30 hours in the second example described above can be obtained.

Figure 13:
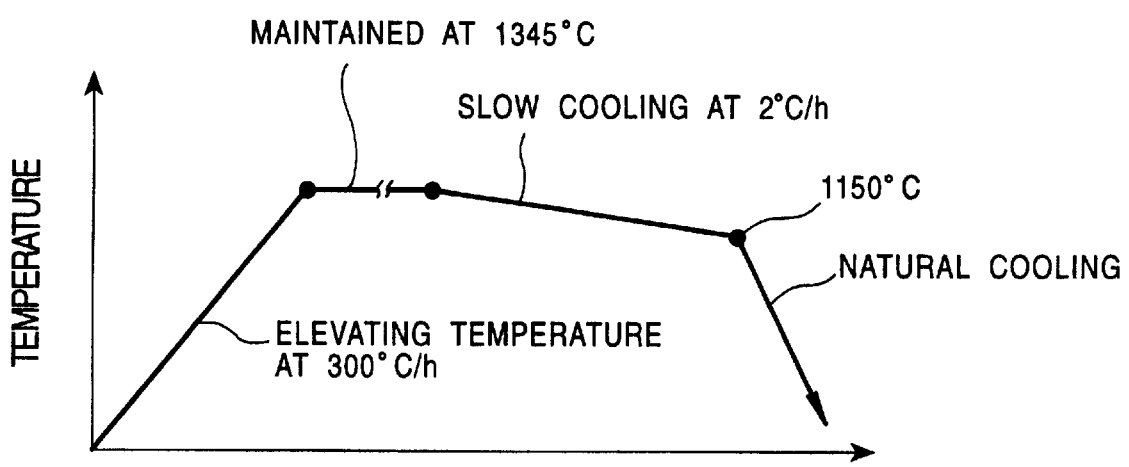
FIG. 13 is a chart showing still another temperature condition in heat treatment carried out in Example 1 of the present invention.

In the present example, the same raw materials as used in the previous example were prepared and blended in the same blend ratio as in the previous example. Then, the double crucible 20 (refer to FIG. 2) and the vertical siliconite furnace 30 (refer to FIG. 3) were used to carry out heat treatment on the temperature condition shown in FIG. 13. That is, the raw material was heated up to 1345° C. at a temperature-elevating rate of 300° C./hour (heating step) and maintained at 1345° C. for 30 hours or longer (constant temperature step). Subsequently, it was slowly cooled down to 1150° C. at a slow cooling rate of 2° C./hour (slow cooling step) and then cooled down to room temperatures. In this case, the maintained time at the constant temperature step was varied to 30 hours, 40 hours, 45 hours and 50 hours respectively.

This allowed the flux to be completely evaporated in the raw material obtained at any maintained time, and only grown crystal remained in the platinum crucible 21. The resulting crystals obtained at a maintained time of 30 hours and 40 hours had a yellow color; one obtained at a maintained time of 45 hours was colorless and transparent; and one obtained at a maintained time of 50 hours had a white color. The respective crystals were as large as 3 mm×4 mm×5 μm in the largest dimensions.

Figure 14:
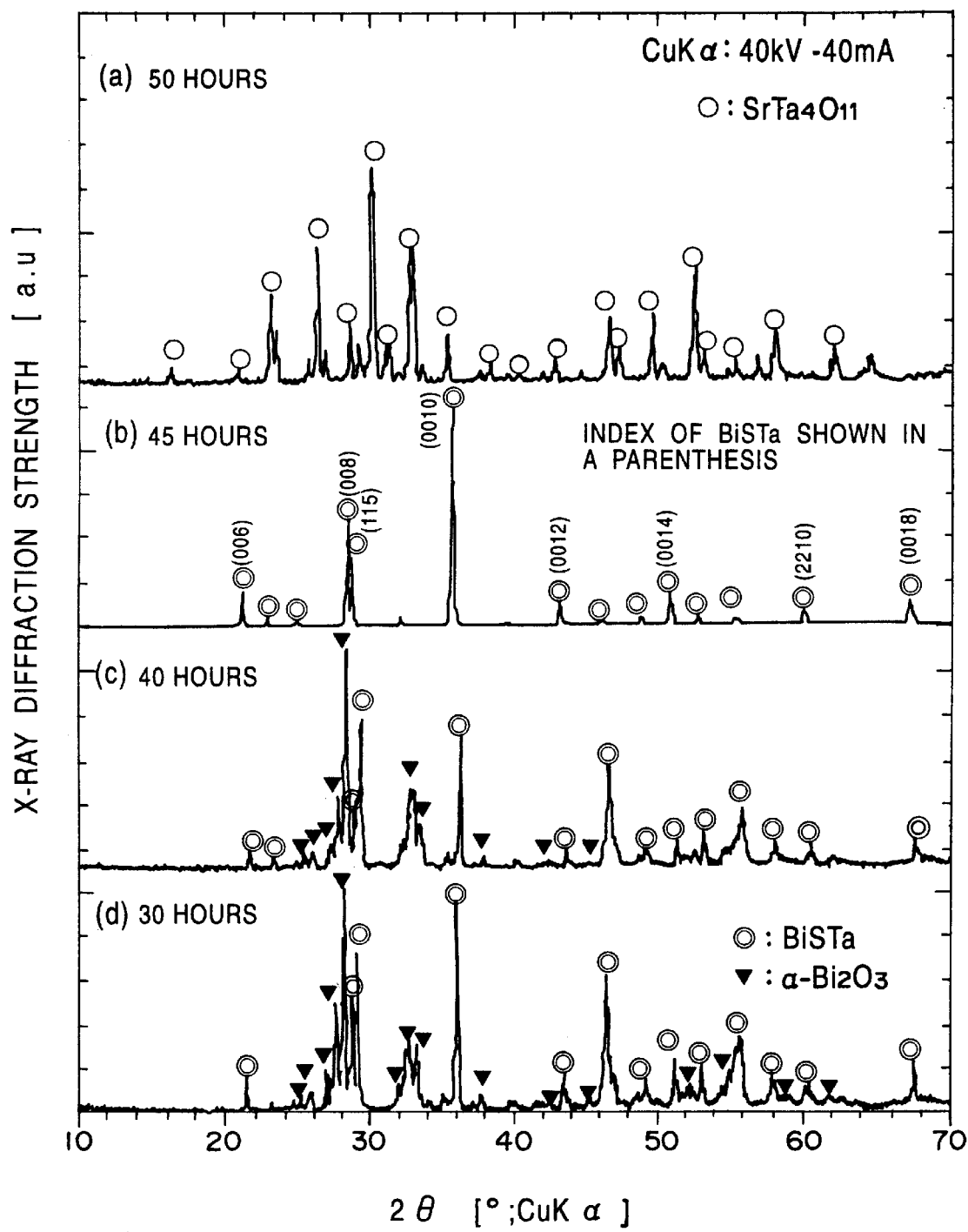
FIG. 14 is an X-ray diffraction pattern diagram for explaining a difference in the composition of crystal obtained at a maintained time of the constant temperature step in the temperature condition shown in FIG. 13.

These crystals each were subjected to identification analysis by X-ray diffraction. The results thereof are shown in FIG. 14. Thus, it was confirmed that the crystal obtained at a maintained time of 45 hours was a layered crystal structure oxide comprising bismuth, strontium, tantalum and oxygen. In contrast with this, it was found that the crystal obtained at a maintained time of 30 hours contained α-$Bi_2O_3$ (JCPDS No. 27-53) as an impurity phase and the crystal obtained at a maintained time of 40 hours had the same tendency and that the greater part of the crystal obtained at a maintained time of 50 hours was turned into $SrTa_4O_{11}$ (JCPDS No. 16-708) which was an impurity phase.

Also in the case where after the raw material was heated to 1330° C. or higher and 1370° C. or lower and maintained for a time of longer than 40 hours and shorter than 50 hours, it was slowly cooled down to 800° C. or higher and 1300° C. or lower at a slow cooling rate of 1° C./hour or more and 5° C./hour or less to grow a layered crystal structure oxide, the same result as that obtained at the maintained time set to 45 hours in the third example described above can be obtained.

It has been found from the results described above that substantially the whole flux can be evaporated by heating the raw material containing bismuth oxide as the flux to a prescribed temperature higher than the melting point, maintaining the raw material at the prescribed temperature for fixed time and then slowly cooling it at a prescribed cooling rate, whereby the single crystal of the layered crystal structure oxide can be produced. It has been found as well that in this case, the shorter maintained time at the constant temperature step results in forming the impurity phase of α-$Bi_2O_3$ (JCPDS No. 27-53) or δ-$Bi_2O_3$ (JCPDS No. 27-52), and the longer maintained time results in forming the impurity phases of $SrTa_4O_{11}$ (JCPDS No. 16-708) and $Sr_2Ta_2O_7$ (JCPDS No. 30-1304).

Example 2

The crystal chemistry structure of the layered crystal structure oxide shall specifically be explained in this example.

First, bismuth oxide, strontium carbonate and tantalum oxide (all are guaranteed reagents manufactured by Kojundo Chemical Laboratory Co., Ltd.) were prepared as raw materials respectively to blend them in a mole ratio of bismuth oxide 79.0, strontium carbonate 10.5 and tantalum oxide 10.5. That is, bismuth oxide was used as a flux here.

Then, the double crucible 20 shown in FIG. 2 was prepared, and the mixed raw material M was put into the inner platinum crucible 21. It was put into the outer alumina crucible 22, and the lid 23 was put thereon. Subsequently, this double crucible 20 was inserted into the vertical siliconite furnace 30 shown in FIG. 3. The raw material M was heated up to 1345° C. at a temperature-elevating rate of 300° C./hour (heating step) and maintained at 1345° C. for 20 hours (constant temperature step). Subsequently, it was slowly cooled down to 1150° C. at a slow cooling rate of 2° C./hour (slow cooling step) and then cooled down to room temperatures, whereby the layered crystal structure oxide was produced.

This allowed the flux to be completely evaporated to obtain the crystal 1 of the flaky layered crystal structure oxide having such dimensions as 0.7 mm×0.2 mm×0.01 mm.

Further, the raw materials were prepared as was the case with the crystal 1 and put into the double crucible 20 shown in FIG. 2, and it was inserted into the vertical siliconite furnace 30 shown in FIG. 3. The raw material was heated up to 1400° C. at a temperature-elevating rate of 300° C./hour (heating step) and maintained at 1400° C. for 2 hours (constant temperature step). Subsequently, it was slowly cooled down to 1200° C. at a slow cooling rate of 5° C./hour (slow cooling step) and then cooled down to room temperatures, whereby the layered crystal structure oxide was produced.

That is, the layered crystal structure oxide was produced by slightly elevating the heating temperature, shortening the maintained time at the constant temperature step and relatively accelerating the slow cooling rate at the slow cooling step as compared with those of the crystal 1. This did not allow the flux to be completely evaporated unlike the crystal 1, and a small amount of α-$Bi_2O_3$ remained in the platinum crucible 21. Thus, the crystal 2 of the flaky layered crystal structure oxide having such dimensions as 0.7 mm×0.2 mm×0.04 mm was obtained. The crystal 1 and the crystal 2 thus obtained were subjected to the following analyses.

First, 4-axis X-ray diffractions each were carried out. Rigaku AFC 5R diffractometer was used for the apparatus, and an Mo-K α ray homogenized by graphite was used for X-ray. As a result thereof, it was found from preliminary measurement that the Bravais lattices each were C-centered orthorhombic, and the lattice constants each were as shown below:

Crystal 1 a=24.982 (8) Å b=5.535 (1) Å c=5.535 (2) Å

Crystal 2 a=25.001 (4) Å b=5.525 (4) Å c=5.525 (2) Å

It was found from the annihilation rule of the diffraction spots that the crystal space groups of the crystal 1 and the crystal 2 were narrowed down to either of Pnnm and Pnn2 on the assumption that twin crystals were not present and narrowed down to any of $Cmc2_1$, Cmcm and C2cm on the assumption that twin crystals were present. Used here as an initial model were the analytical results obtained by Newnham, Rae et al. (R. E. Newnham, R. W. Wolfe, R. S. Horsey, F. A. Diaz-Colon and M. I. Kay, Mater. Res. Bull., 8 (1973) 1183.; A. D. Rae, J. G. Thompson and R. L. winters, Acta. Cryst., B48 (1992) 418.), and the diffraction strength distribution of each of them was statistically analyzed. Finally, it was confirmed that twin crystals were present in both the crystal 1 and the crystal 2 and the crystal space group was $Cmc2_1$.

Incidentally, this space group is a standard setting published in "International Tables for Crystallography". In a setting in which a c axis conventionally used so often is used for a major axis, the space group is $A2_1am$, and this is consistent as space symmetry with the analytical results obtained by Newnham, Rae et al.

More difference in the lattice constants of the b axes and the lattice constants of the c axes than in terms of accuracy was not observed from the results of refine in both the crystal 1 and the crystal 2, but it can be concluded from the space symmetry that they are not equivalent. In order to confirm this fact, the crystal 1 and the crystal 2 were observed respectively under a polarization microscope under a cross nicole state. The a planes were observed. As a result thereof, periodic occulting reversal was observed in both the crystal 1 and the crystal 2, and it was confirmed that the lattice constant of the c axis was not apparently equal to that of the b axis.

Then, the crystal structures were made fine respectively by least square refinement according to the Paterson method using an analysis software "SAPI91" (Fan Hai-Fu (1991), Structure Analysis Programs With Intelligent Control, Rigaku Corporation, Tokyo, Japan). The atomic coordinate (according to initial analysis on the assumption of the presence of twin crystals and without assuming the partial substitution of the elements) of the crystal 1 is shown in Table 2. As a result thereof, the displacement of the atomic site was observed from the basic crystal structure (space group: I4/mmm) shown in FIG. 1, and it was found that the crystal had spontaneous polarization in a c axis direction (space group: $Cmc2_1$). The reliability factor (R-factor) by this refinement was 3.7%.

TABLE 2

| Element | Site | Filling rate | x | y | z |
|---|---|---|---|---|---|
| Bi(1) | 8b1 | 1.0000 | 0.2023 | 0.2317 | 0.5153 |
| Ta(1) | 8b1 | 1.0000 | 0.0912 | 0.2482 | 0.0289 |
| Sr(2) | 4am | 0.5000 | 0.0000 | 0.2562 | 0.5388 |
| O(1) | 4am | 1.0000 | 0.0000 | 0.2811 | 0.0121 |
| O(2) | 8b1 | 1.0000 | 0.1587 | 0.2095 | 0.0392 |
| O(3) | 8b1 | 1.0000 | 0.2505 | −0.0003 | 0.3456 |
| O(4) | 8b1 | 1.0000 | −0.0687 | −0.0028 | 0.2850 |
| O(5) | 8b1 | 1.0000 | 0.0804 | 0.5006 | 0.2749 |

Further, in order to cause this reliability factor to converge, the crystal structure of the crystal 1 was made fine based on a model in which bismuth contained in the fluorite layer 11 was partially cross-substituted with strontium contained in the perovskite layer 12. The results thereof are shown in Table 3. In Table 3, Bi (2) is bismuth present at the strontium site Sr (2), and Sr (1) is strontium present at the bismuth site Bi (1). It was observed from this result that bismuth was cross-substituted with strontium by 5% at the bismuth site and by about 2% at the strontium site in the crystal 1. The reliability factor was improved as well, though as slight as 3.5%.

TABLE 3

| Element | Site | Filling rate | x | y | z |
|---|---|---|---|---|---|
| Bi(1) | 8b1 | 0.9500 | 0.2024 | 0.2315 | 0.5153 |
| Bi(2) | 4am | 0.0107 | 0.0000 | 0.2559 | 0.5418 |
| Ta(1) | 8b1 | 1.0000 | 0.0921 | 0.2483 | 0.0350 |
| Sr(1) | 8b1 | 0.0545 | 0.2024 | 0.2315 | 0.5153 |
| Sr(2) | 4am | 0.4900 | 0.0000 | 0.2559 | 0.5430 |
| O(1) | 4am | 0.5000 | 0.0000 | 0.2810 | 0.0080 |
| O(2) | 8b1 | 1.0000 | 0.1590 | 0.2100 | 0.0440 |
| O(3) | 8b1 | 1.0000 | 0.2505 | −0.0004 | 0.3600 |
| O(4) | 8b1 | 1.0000 | −0.0687 | −0.0030 | 0.2780 |
| O(5) | 8b1 | 1.0000 | 0.0802 | 0.5000 | 0.2740 |

It can be said that since many fining parameters are present in the model in which partial cross-substitution is caused, the reliability factor is mathematically improved as a matter of course. No problems are involved in the scattering power of X-ray against heavy elements, and the absolute value of the reliability factor is of such extent as capable of indicating that this model is statistically correct. Accordingly, it is considered that bismuth is, though only slightly, partially substituted with strontium in this crystal 1.

Based on this result, the composition ratio of bismuth, strontium and tantalum in this crystal 1 was determined to find that it was as shown below:

Crystal 1 Bi:Sr:Ta=1.92:1.09:2

With respect to the crystal 2, a difference between the simulation data and the measured diffraction data was statistically too large in a model in which partial substitution of the elements was not assumed, and therefore the reliability factor did not come to converge. Accordingly, in order to cause the reliability factor to converge, a model in which bismuth contained in the fluorite layer 11 was partially cross-substituted with strontium contained in the perovskite layer 12 was set up to make the crystal structure fine as was the case with the crystal 1. The results thereof are shown in Table 4. Also in Table 4, Bi (2) is bismuth present at the strontium site Sr (2), and Sr (1) is strontium present at the bismuth site Bi (1). It was observed from this result that bismuth was notably cross-substituted with strontium by 42% at the bismuth site and by about 26% at the strontium site in the crystal 2. The reliability factor was 3.2%. The reliability factor converges to a reliable level, and therefore it is considered that bismuth is partially substituted with strontium to a very large extent in the crystal 2.

TABLE 4

| Element | Site | Filling rate | x | y | z |
|---|---|---|---|---|---|
| Bi(1) | 8b1 | 0.5820 | 0.2020 | 0.2252 | 0.5147 |
| Bi(2) | 4am | 0.1317 | 0.0000 | 0.2551 | 0.4958 |
| Ta(1) | 8b1 | 1.0000 | 0.0847 | 0.2481 | 0.0430 |
| Sr(1) | 8b1 | 0.4179 | 0.2020 | 0.2252 | 0.5147 |
| Sr(2) | 4am | 0.3700 | 0.0000 | 0.2551 | 0.4960 |
| O(1) | 4am | 0.5000 | 0.0000 | 0.2830 | 0.0700 |
| O(2) | 8b1 | 0.5000 | 0.1616 | 0.2360 | −0.0310 |
| O(2') | 8b1 | 0.5100 | 0.1564 | 0.1810 | 0.0690 |
| O(3) | 8b1 | 0.3000 | 0.2560 | 0.0290 | 0.2100 |
| O(4) | 8b1 | 1.0000 | −0.0698 | 0.0000 | 0.2940 |
| O(5) | 8b1 | 1.0000 | 0.0806 | 0.4790 | 0.3200 |

Based on this result, the composition ratio of bismuth to strontium in the crystal 2 was determined to find that it was as shown below:

Crystal 2 Bi:Sr:Ta=1.43:1.58:2

From these results, a crystal chemical change in the whole crystal structure brought about following the partial substitution of bismuth with strontium can be considered as follows. That is, the multiplicity of a 8b-site in which $Bi^{3+}$ is present is twice as large as that of a 4a-site in which $Sr^{2+}$ is present, and therefore the partial substitution caused at these sites tends to decrease $Bi^{3+}$ and increase $Sr^{2+}$. As a result thereof, a positive charge in the crystal decreases, and oxygen deficiency is required in order to maintain neutrality in charge.

As can be found from FIG. 1, this layered crystal structure oxide has different five oxygen sites, and oxygen O (1) present in an SrO plane, oxygen O (2) located at a boundary between the fluorite layer 11 and the perovskite layer 12, oxygen O (3) present in fluorite layer 11, and oxygen O (4) and O (5) present in $TaO_2$ can be described respectively. O (4) and O (5) are very close to each other in terms of chemical environment, but they can be distinguished by a reduction ($Cmc2_1$ from F4/mmm) in the symmetry following lattice distortion. It can be from Table 4 that out of these oxygens, only the oxygen O (3) present in fluorite layer 11 has a very small filling rate and the oxygen at this O (3) site is liable to be selectively deficient. This can sufficiently be expected from a large non-stoichiometric property held by the fluorite pahse.

To be further characteristic, the O (2) site is divided into two sites of O (2) and O (2') each having a filling rate of about 50%. However, because of increased Coulomb repulsion, it is almost impossible from a realistic point of view that the O (2) site and the O (2') site which are the closest to each other are occupied at the same time, and therefore it is reasonable to consider that either of the O (2) site and the O (2') site which are the closest to each other is occupied.

Such deficient structure is expected to be usual to a certain extent and considered to originate fundamentally in the partial cross-substitution of bismuth with strontium which was confirmed in the present example, and the deficient structure is considered to change in various forms such as one-sided partial substitution caused by bismuth present at the strontium site due to a change in the composition and substitution between the different sites.

Figure 15:
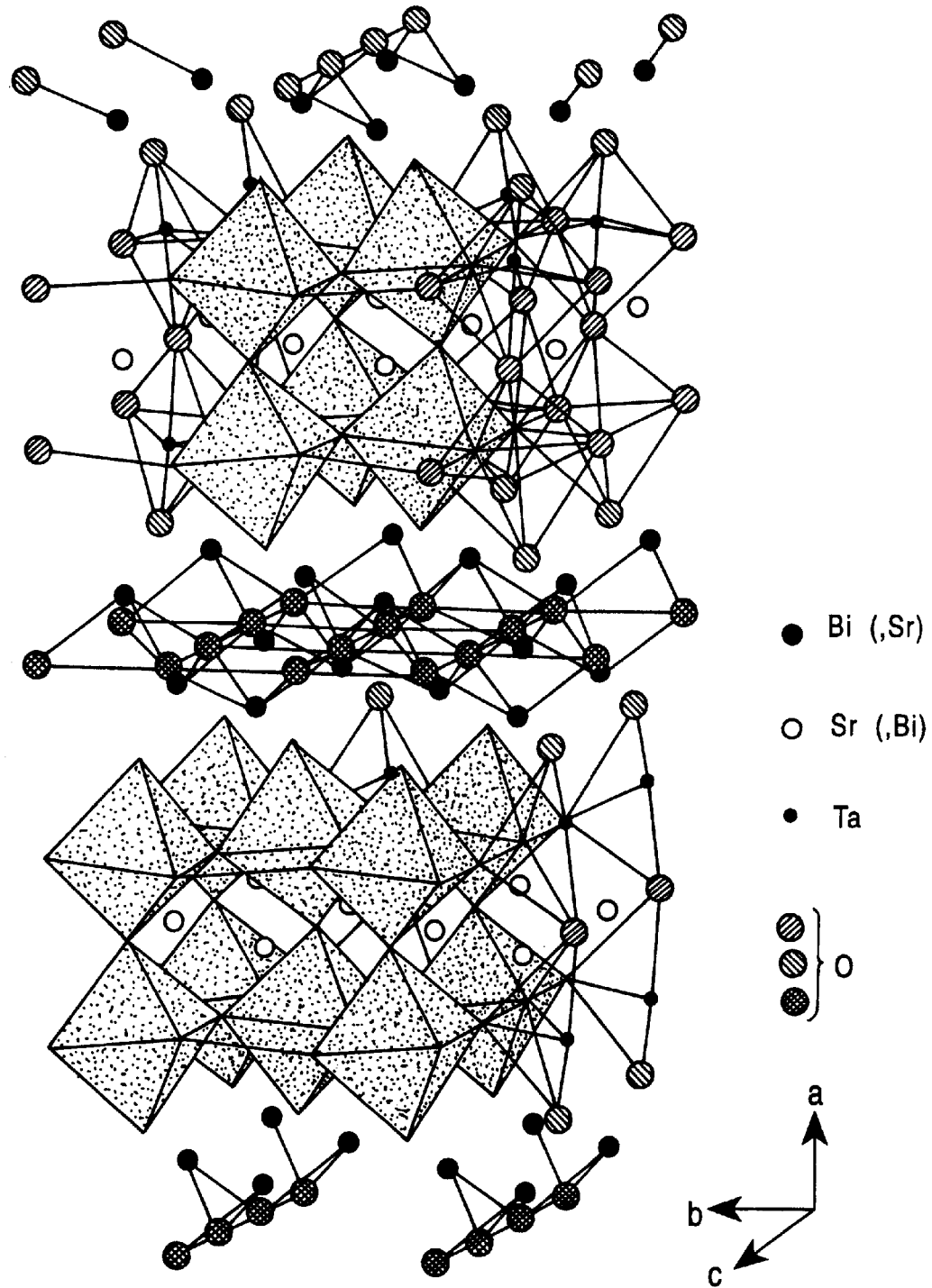
FIG. 15 is a conceptual diagram showing the crystal structure including a lattice distortion thereof, of a layered crystal structure oxide (crystal 1) related to Example 2 of the present invention.
Figure 16:
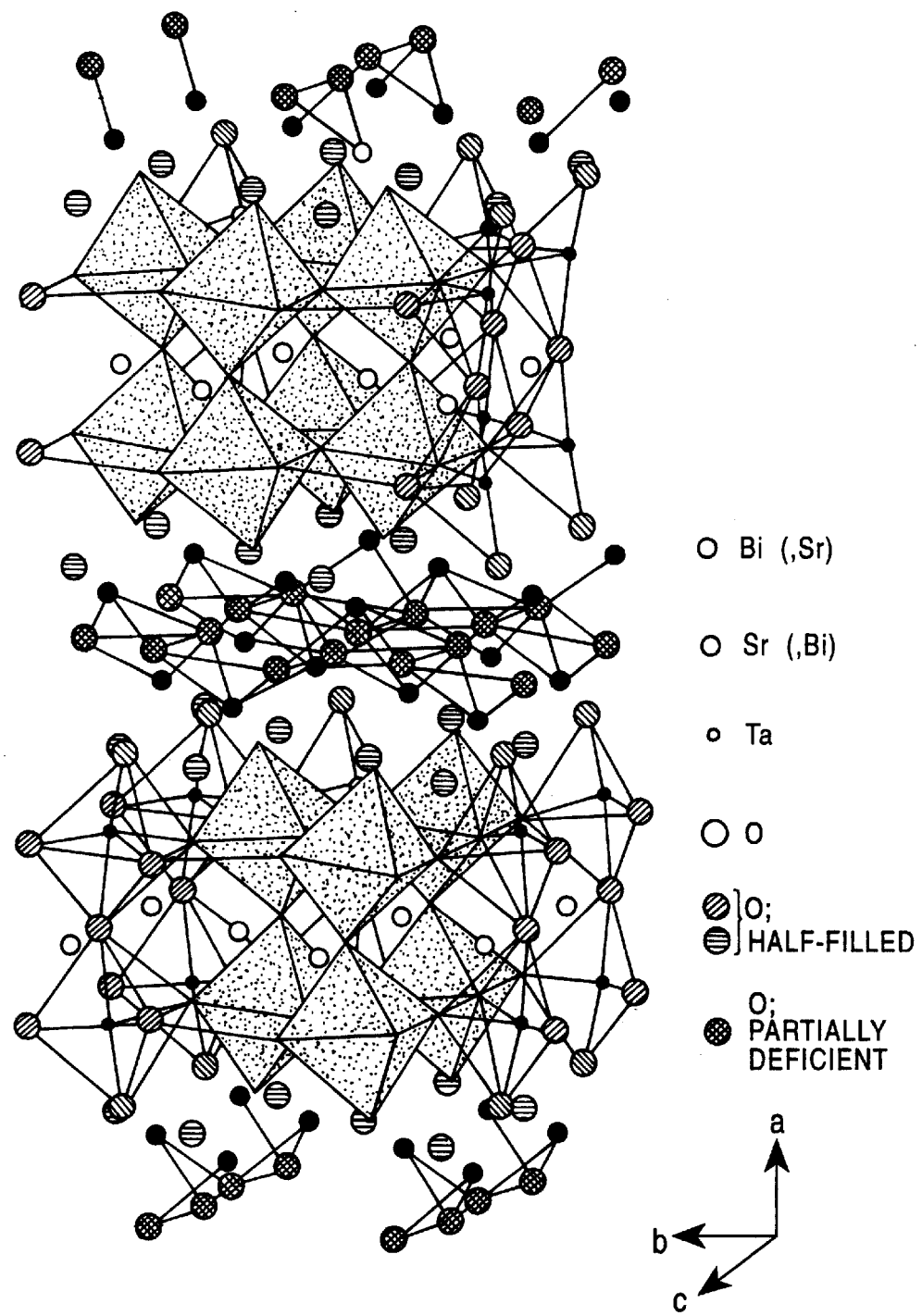
FIG. 16 is a conceptual diagram showing the crystal structure including a lattice distortion thereof, of the layered crystal structure oxide (crystal 2) related to Example 2 of the present invention.

Shown in FIG. 15 is the crystal structure of the crystal 1 reproduced faithfully including lattice distortion based on the results obtained above. The crystal structure of the crystal 2 reproduced in the same manner is shown in FIG. 16. In FIG. 15 and FIG. 16, one unit cell is shown in the a axis direction and two unit cells in the b axis and c axis directions. In this connection, the structure of $TaO_6$ was shown by an octahedron in order to avoid complicatedness. Tantalum and oxygen are shown as atoms respectively in a part where a complete octahedron is not formed at a boundary area.

Figure 17:
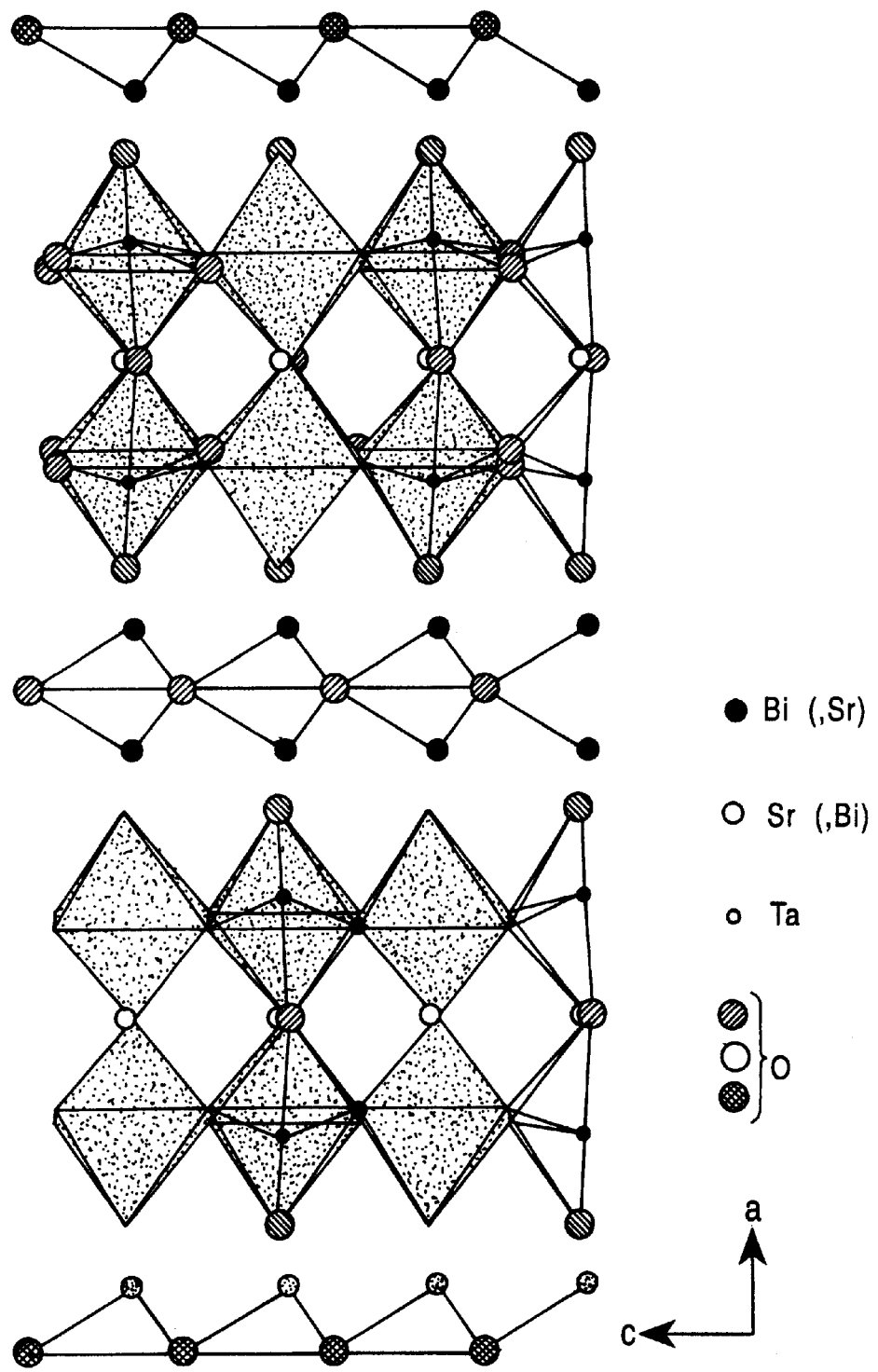
FIG. 17 is a conceptual diagram showing the crystal structure including a lattice distortion thereof, seen from a b axis, of the layered crystal structure oxide (crystal 1) shown in FIG. 15.
Figure 18:
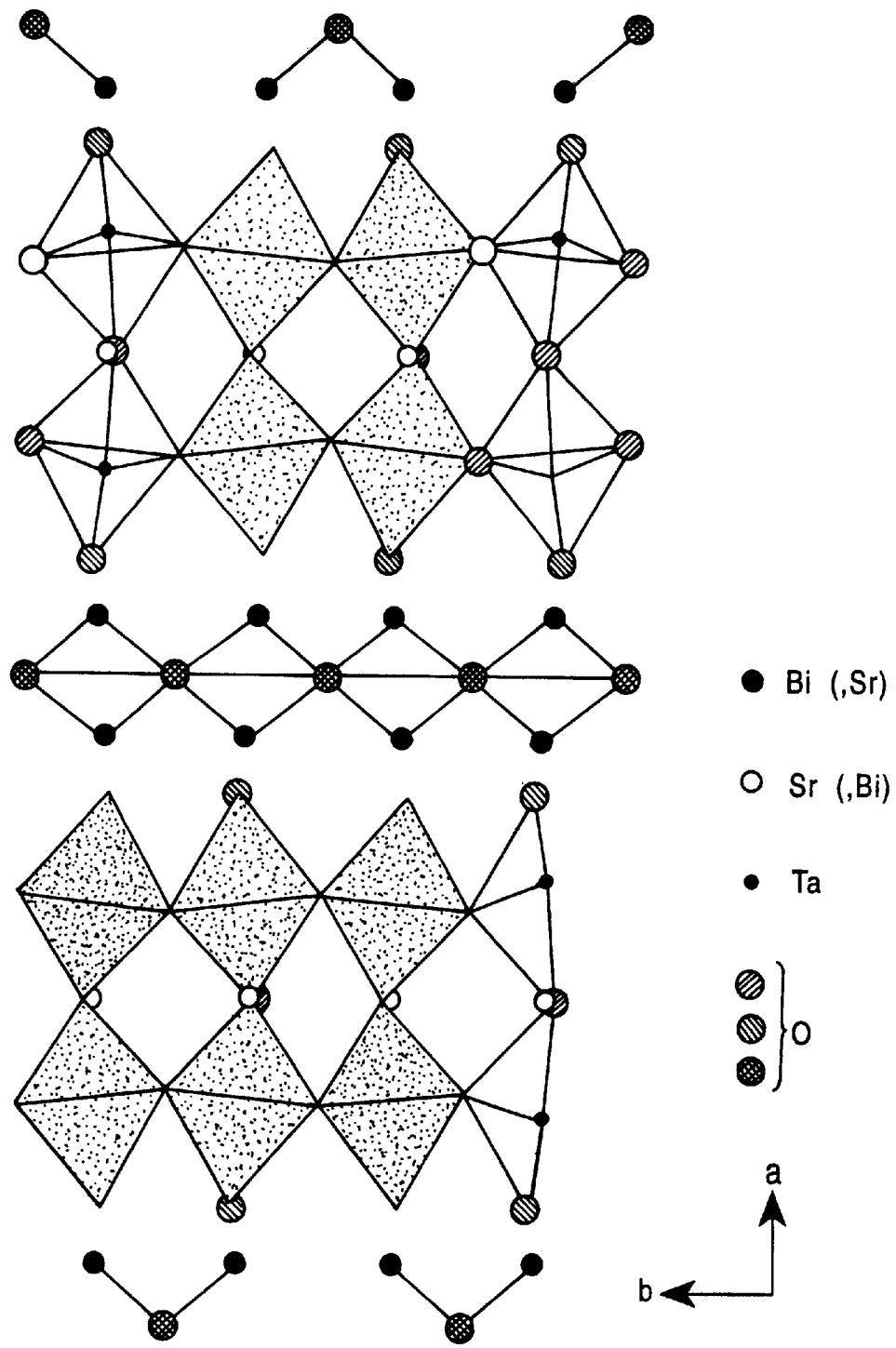
FIG. 18 is a conceptual diagram showing the crystal structure including a lattice distortion thereof, seen from a c axis, of the layered crystal structure oxide (crystal 1) shown in FIG. 15.
Figure 19:
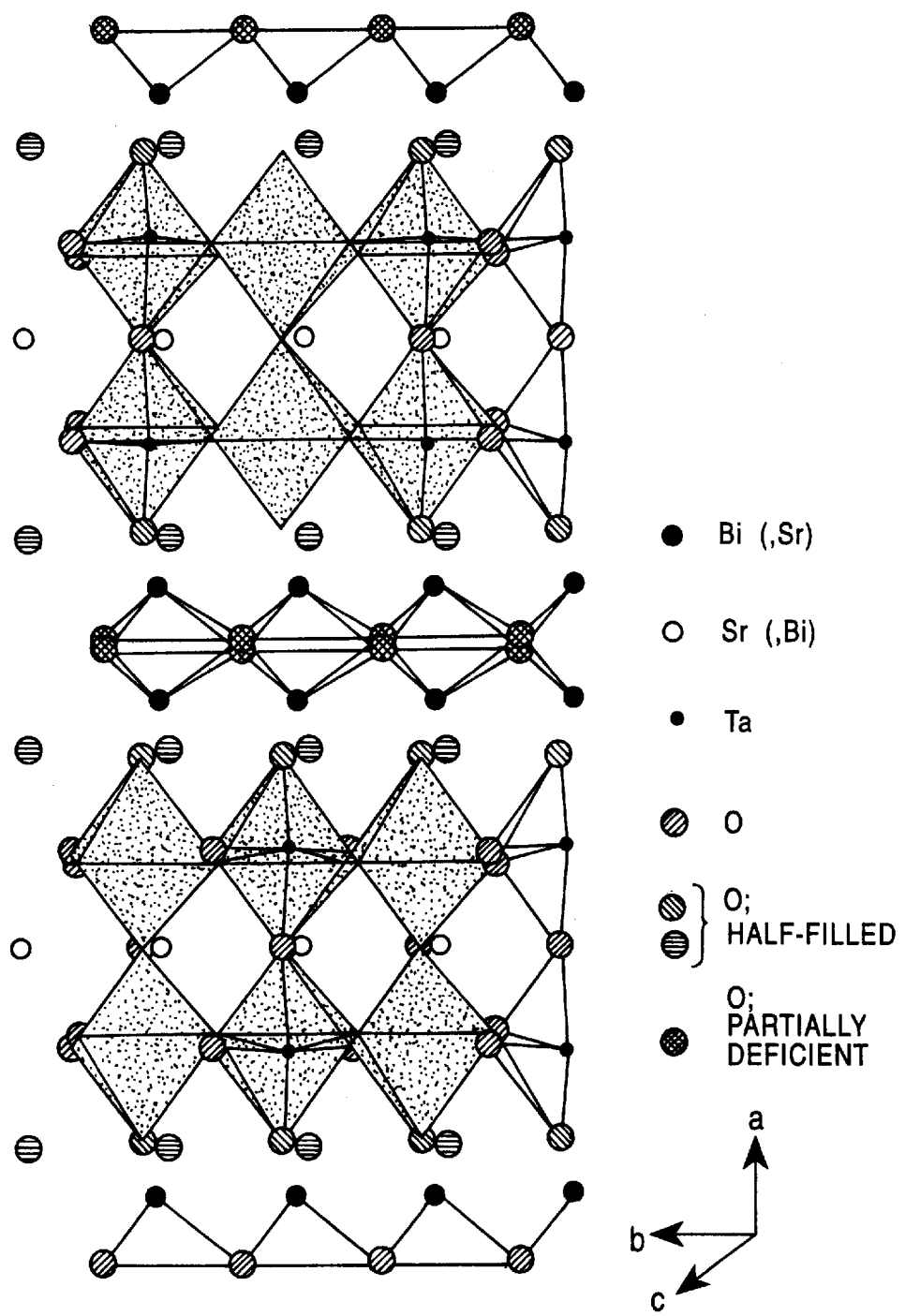
FIG. 19 is a conceptual diagram showing the crystal structure including a lattice distortion thereof, seen from a b axis, of the layered crystal structure oxide (crystal 2) shown in FIG. 16.
Figure 20:
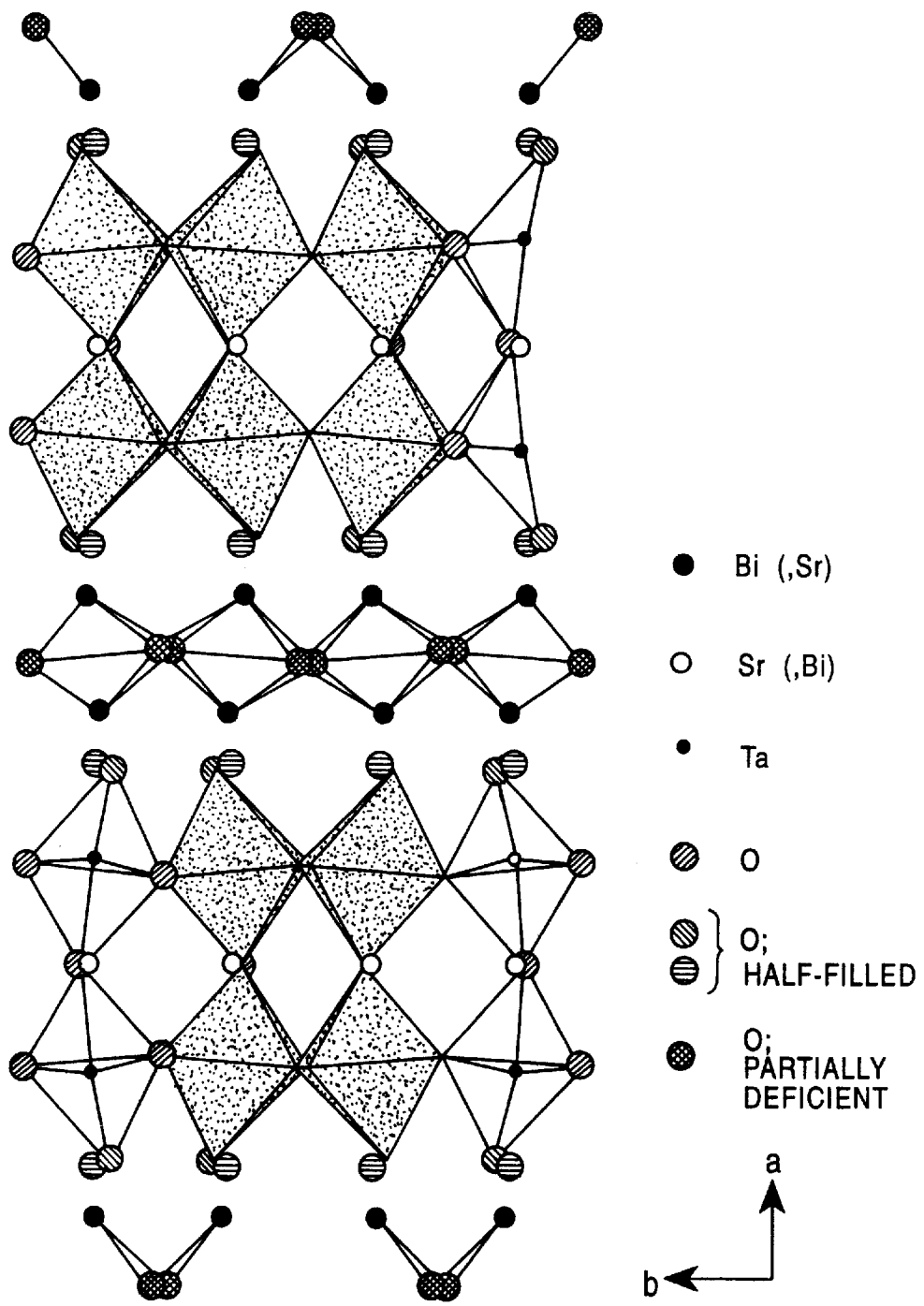
FIG. 20 is a conceptual diagram showing the crystal structure including a lattice distortion thereof, seen from a c axis, of the layered crystal structure oxide (crystal 2) shown in FIG. 16.

Further, a crystal structure obtained by seeing FIG. 15 (that is, the crystal 1) from the b axis direction is shown in FIG. 17, and a crystal structure obtained by seeing the same from the c axis direction is shown in FIG. 18. Similarly, a crystal structure obtained by seeing FIG. 16 (that is, the crystal 2) from the b axis direction is shown in FIG. 19, and a crystal structure obtained by seeing the same from the c axis direction is shown in FIG. 20. It can be found from FIG. 17 and FIG. 18 that in the crystal 1, an oxygen plane in the fluorite layer 11 is almost flat and the gradient of a $TaO_2$ plane in the octahedron of $TaO_6$ is brought about almost around the c axis which is a polarization axis (that is, the rotation axis is the c axis). Further, it can be found from FIG. 19 and FIG. 20 that an oxygen plane in the fluorite layer 11 is curved in the crystal 2. Incidentally, it is as described above that in the crystal 2, deficiency is present considerably at the oxygen site and a peak oxygen site present at the boundary to the fluorite layer is separated (an octahedron is shown here, wherein O (2') having a smaller interatomic distance to tantalum is an apex).

Further, it is considered from FIG. 17 to FIG. 20 that in the crystal 1 and the crystal 2, relative displacement between bismuth and oxygen as well as polarization in the perovskite layer 12 is by no means small as well in the fluorite layer 11 and they contribute to the polarization. Actually, polarization axis components in relative displacement between a cation (bismuth or strontium substituted at the bismuth site) and an anion (oxygen O (3)) in the fluorite layer have been calculated on the basis of a host structure (F4/mmm) having no lattice distortion to find that the polarization axis components are about 8.97% in the crystal 1 and about 5.47% in the crystal 2 based on the unit lattice length ($C_0 \approx 5.5$ Å) of the polarization axis (c axis). In general, mainly the perovskite layer 12 is considered to be responsible for polarization, and no example has so far been confirmed in which such large polarization is produced in the fluorite layer 11.

In this connection, the polarization axis components in relative displacement between a cation and an anion in the fluorite layer in the analytical result obtained by Newnham and Rae (R. E. Newnham, R. W. Wolfe, R. S. Horsey, F. A. Diaz-Colon and M. I. Kay, Mater. Res. Bull., 8 (1973) 1183.; A. D. Rae, J. G. Thompson and R. L. winters, Acta. Cryst., B48 (1992) 418.) are 2.80% and 1.69% respectively.

The unit lattice length of the polarization axis has been defined similarly to a conventional fluorite phase and set to about 5.5 Å. However, when a long period structure is present in a polarization axis or on a bc plane and a ca plane including this, the lattice constant becomes large, and the calculated value of the polarization axis component in this relative displacement becomes seemingly small. Accordingly, in such case, a polarization axis component in relative displacement shall be estimated based on a unit lattice length corresponding to a conventional fluorite phase.

Figure 21:
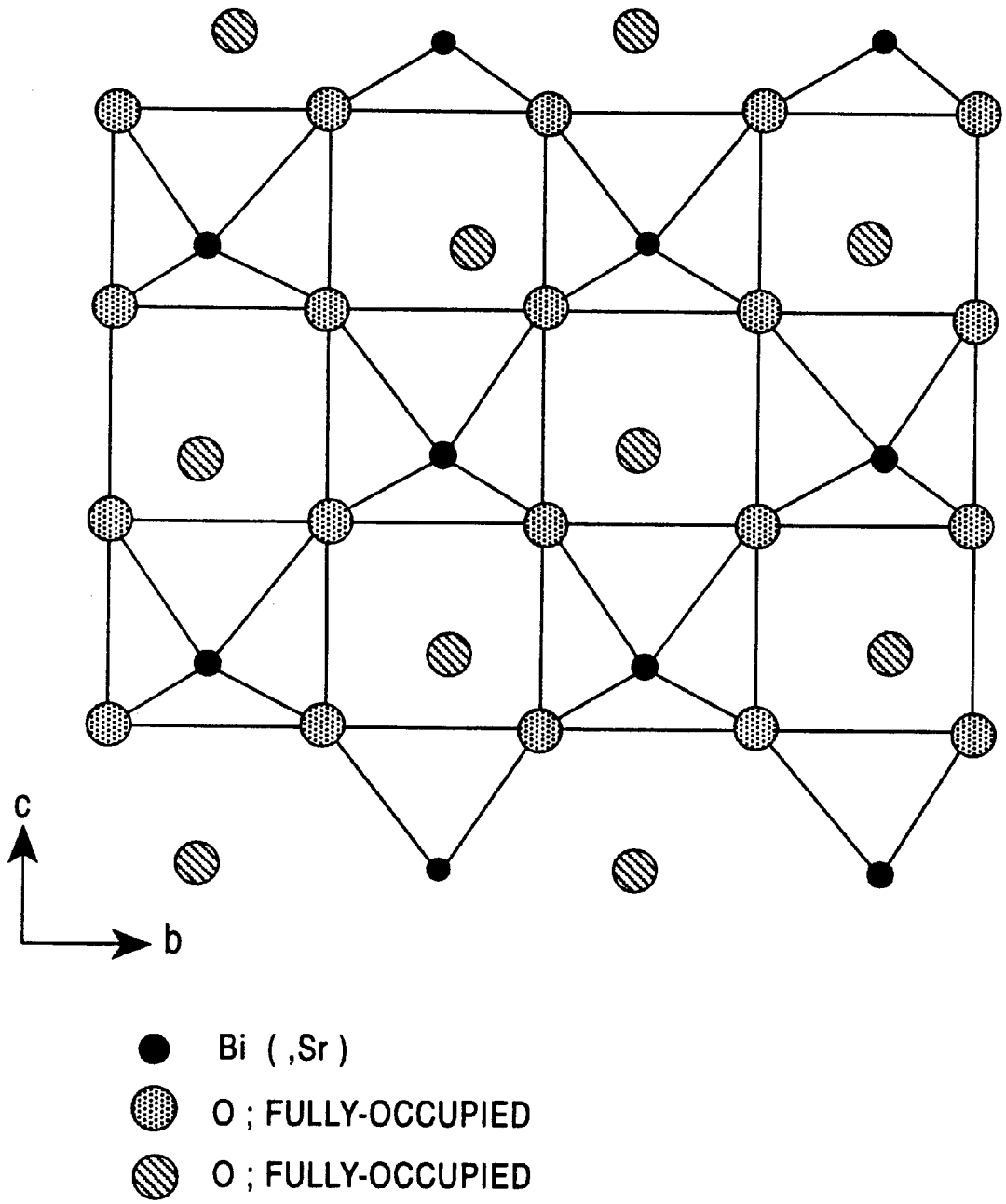
FIG. 21 is a conceptual diagram showing a crystal structure including a lattice distortion thereof, seen from an a axis, in which a fluorite layer and peak oxygens adjacent thereto are taken out of the layered crystal structure oxide (crystal 1) shown in FIG. 15.
Figure 22:
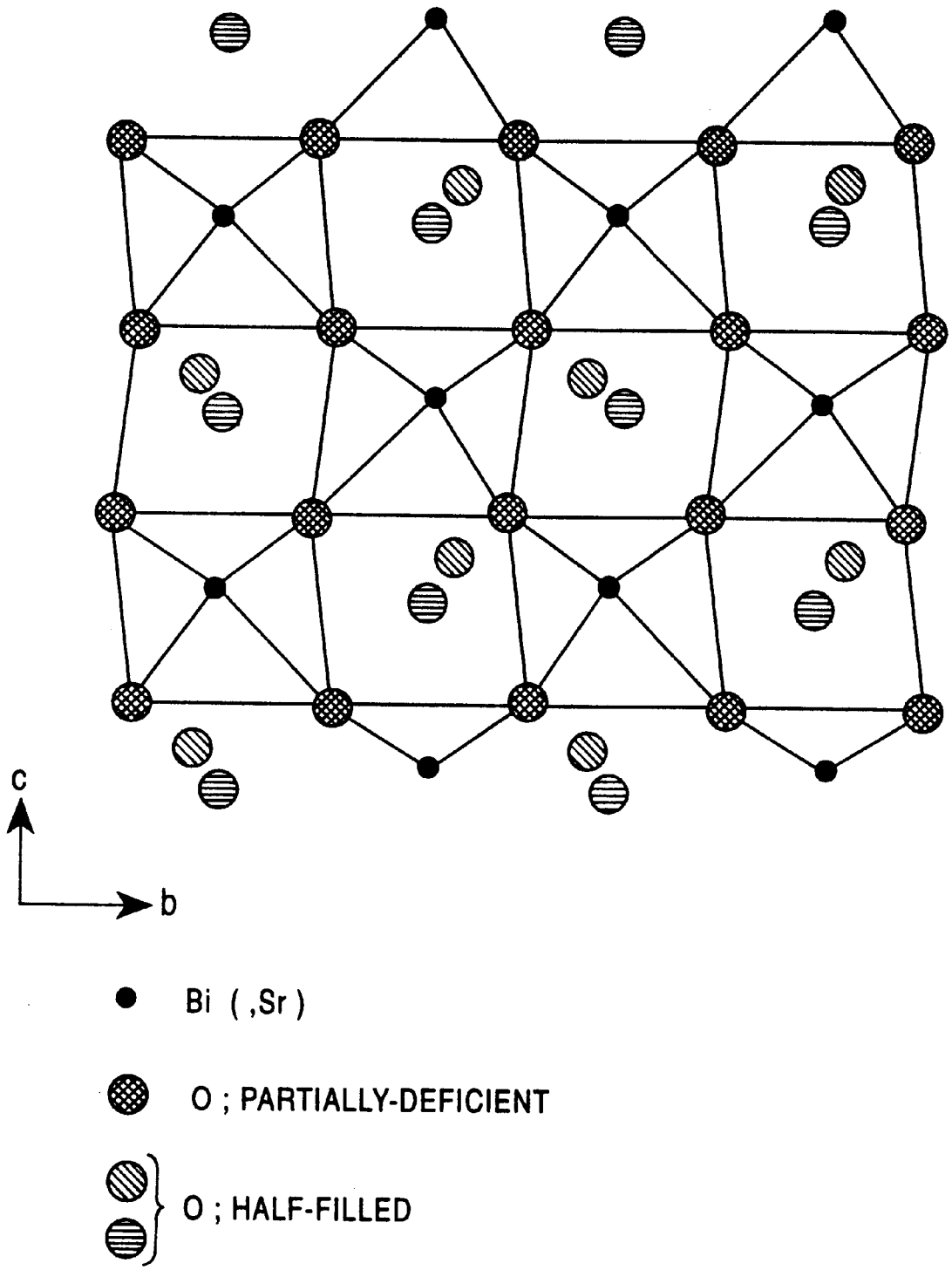
FIG. 22 is a conceptual diagram showing a crystal structure including a lattice distortion thereof, seen from an a axis, in which a fluorite layer and peak oxygens adjacent thereto are taken out of the layered crystal structure oxide (crystal 2) shown in FIG. 16.

A crystal structure obtained by taking out the fluorite layer 11 and the peak oxygens adjacent thereto and seeing them from the a axis direction in the crystal 1 is shown in FIG. 21, and similarly, a crystal structure obtained by taking out the fluorite layer 11 and the peak oxygens adjacent thereto in the crystal 2 and seeing them from the a axis direction is shown in FIG. 22. Further, a crystal structure obtained by taking out a $TaO_6$ octahedron in the perovskite layer 12 and strontiums adjacent thereto in the crystal 1 and seeing them from the a axis direction is shown in FIG. 23, and similarly, a crystal structure obtained by taking out a $TaO_6$ octahedron in the perovskite layer 12 and strontiums adjacent thereto in the crystal 2 and seeing them from the a axis direction is shown in FIG. 24.

It can be found from FIG. 21 and FIG. 22 that the bond of the oxygen O (3) in the fluorite layer 11 which is almost flat and less distorted in the crystal 1 is distorted to a large extent in a bc plane in the crystal 2 while the flatness of the bc plane is damaged due to oxygen deficiency in the crystal 2. Further, it can be found that the disorder of the peak oxygen which is observed in the crystal 2 is close to a (b+C) direction but not a polarization direction (c axis direction) or a direction vertical thereto.

Figure 23:
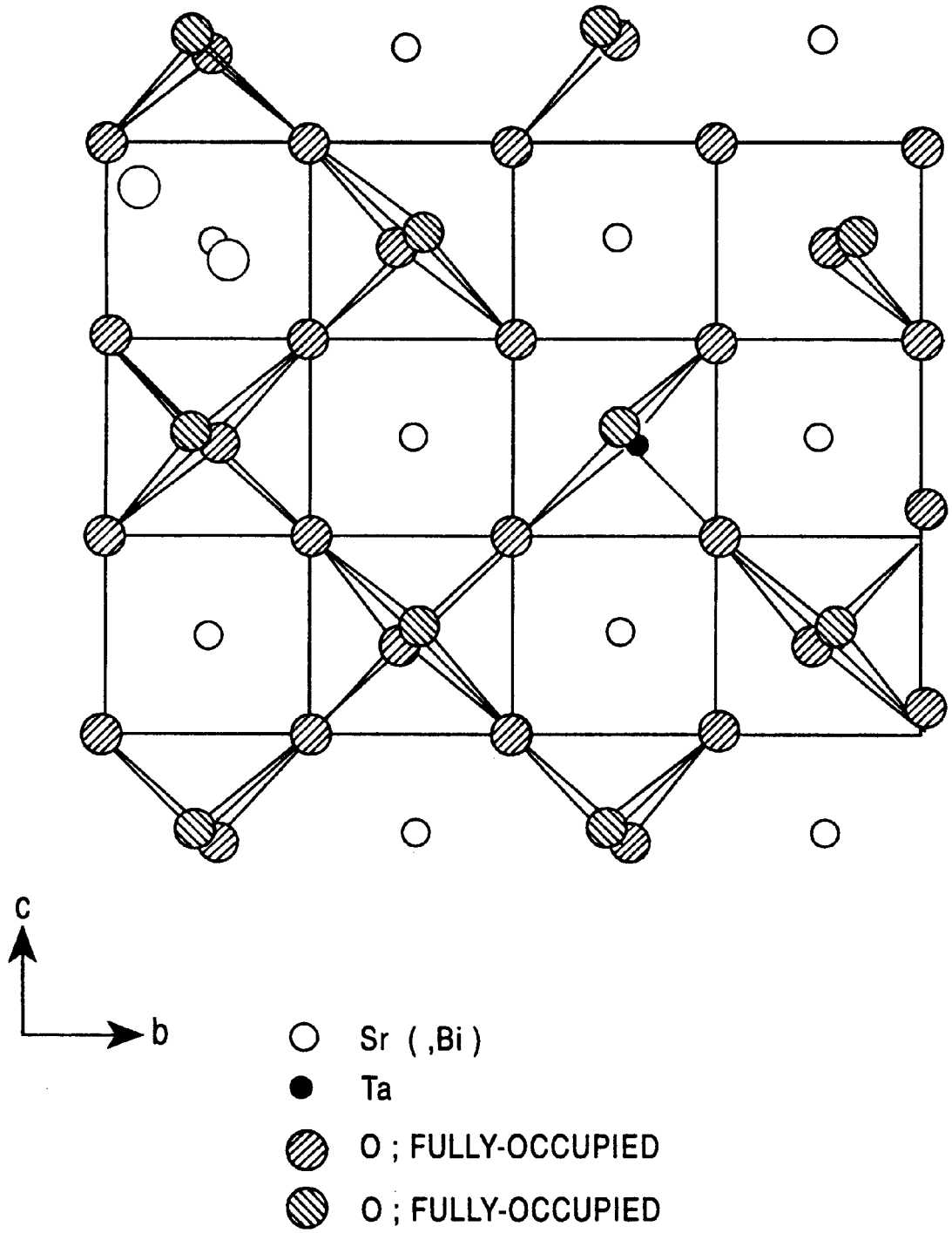
FIG. 23 is a conceptual diagram showing a crystal structure including a lattice distortion thereof, seen from an a axis, in which a $TaO_6$ octahedron in a perovskite layer and strontiums adjacent thereto are taken out of the layered crystal structure oxide (crystal 1) shown in FIG. 15.
Figure 24:
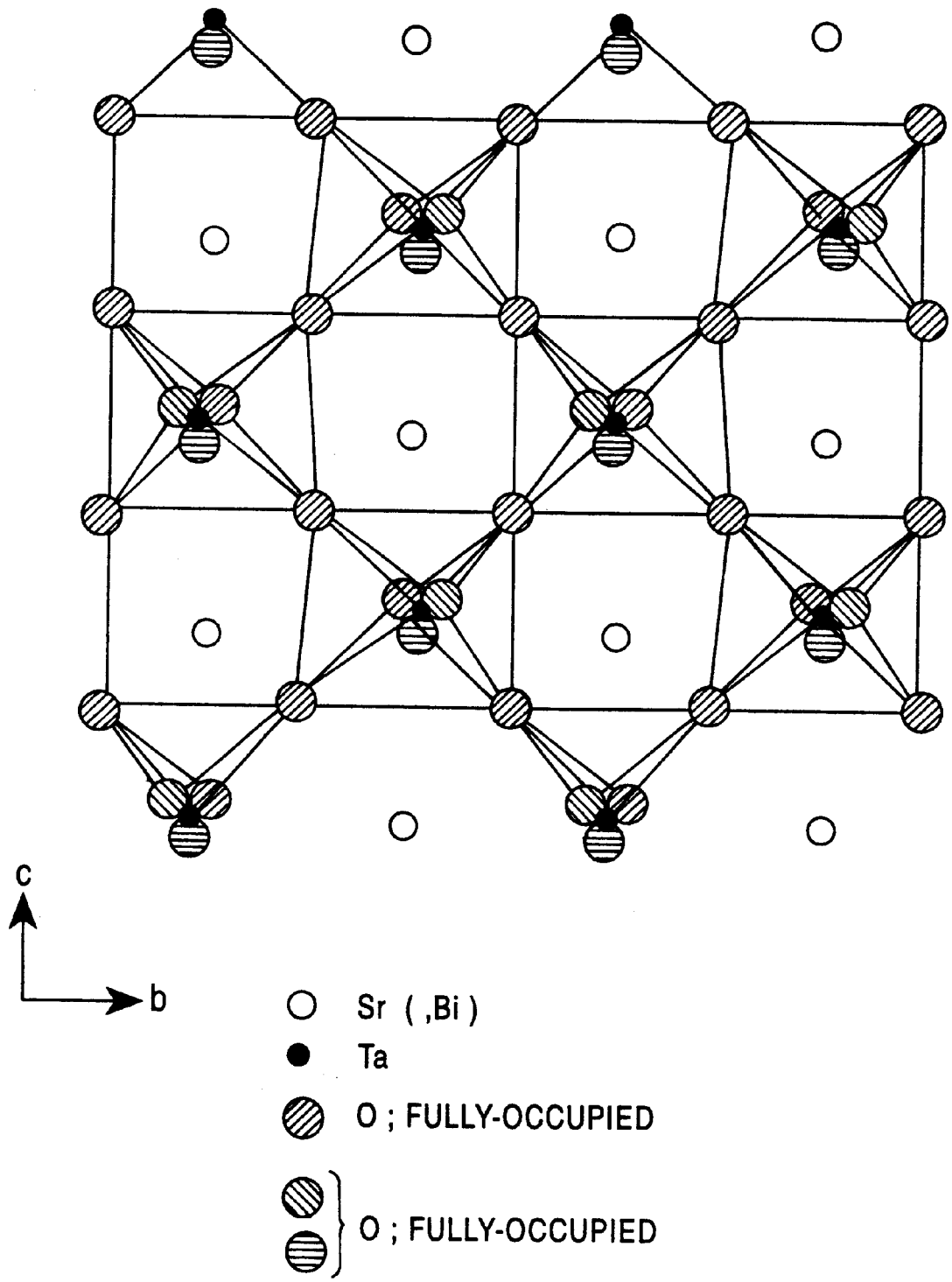
FIG. 24 is a conceptual diagram showing a crystal structure including a lattice distortion thereof, seen from axis, in which a $TaO_6$ octahedron in a perovskite layer strontiums adjacent thereto are taken out of the red crystal structure oxide (crystal 2) shown in FIG. 16.
Figure 25:
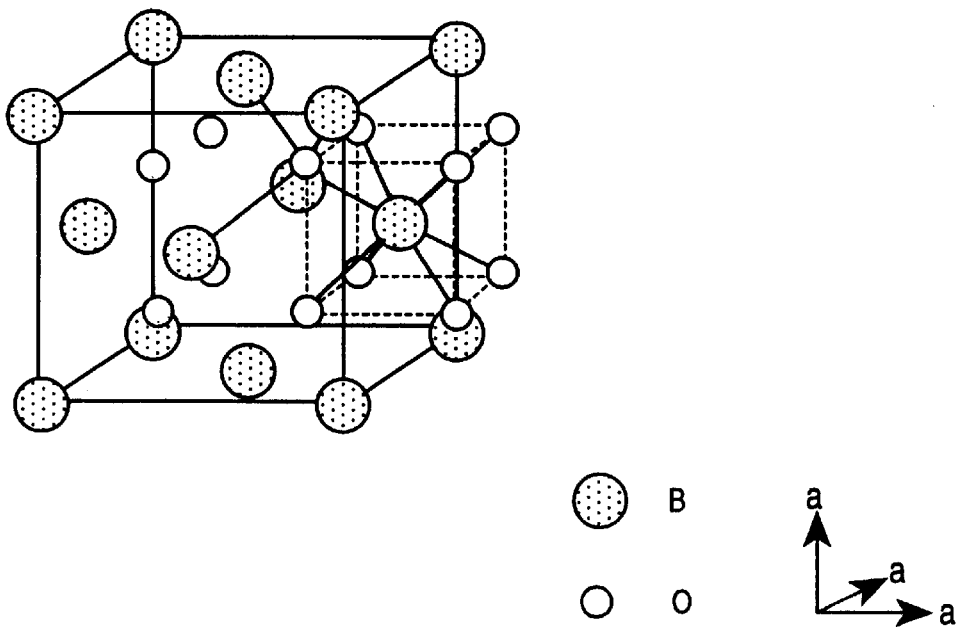
FIG. 25 is a conceptual diagram showing a crystal structure in a fluorite phase.
Figure 26:
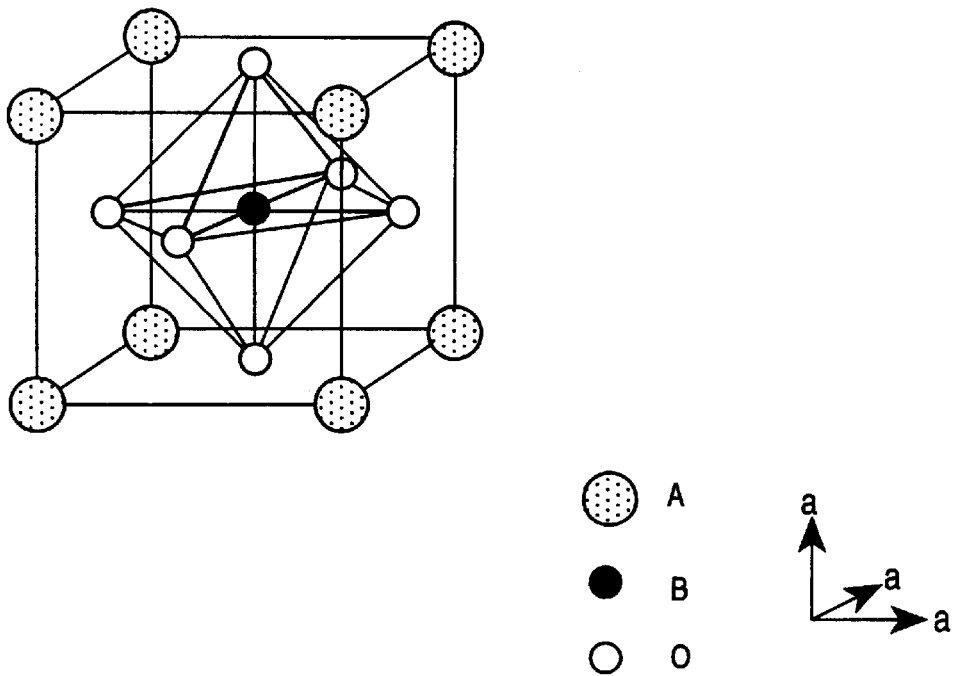
FIG. 26 is a conceptual diagram showing a crystal structure in a perovskite phase.

Further, it can be found from FIG. 23 and FIG. 24 that as described above, the gradient of a $TaO_2$ plane is brought about almost around the c axis which is a polarization axis but peak oxygen has a component of b axis rotation. On the other hand, it can be found that in the crystal 2, the bond of $TaO_2$ is distorted in the bc plane in corporation with disorder of peak oxygen.

It has been found from the matters described above that this layered crystal structure oxide shows a characteristic paraelectricity or ferroelectricity by partial substitution of bismuth with strontium, selective deficiency of oxygens constituting the fluorite layer, disorder of peak oxygens located at a boundary between the fluorite layer 11 and the perovskite layer or mutual relative displacement of a cation and an anion in the fluorite layer 11.

The present invention has been explained above with reference to the embodiments and the respective examples, but the present invention shall not be restricted to these embodiments and examples, and various modifications shall be possible. For example, in the examples described above, the layered crystal structure oxides having a stoichiometric composition formula of $Bi_2Sr_1Ta_2O_9$ were explained, but in the present invention, the same results can be obtained as well from a layered crystal structure oxide of a so-called Aurivillius crystallographic group other than those represented by the formula (I).

To specifically explain, the present invention can be applied as well to the layered crystal structure oxides represented by the chemical formulas of $Bi_2BiTiNbO_9$ and $Bi_2BiTiTaO_9$ each corresponding to m=2 in the formula (I), the layered crystal structure oxide represented by the chemical formula of $Bi_4Ti_3O_{12}$ corresponding to m=3, the layered crystal structure oxides represented by the chemical formulas of $Bi_2Bi_2CaTi_4O_{15}$, $Bi_2Bi_2SrTi_4O_{15}$, $Bi_2Bi_2BaTi_4O_{15}$, $Bi_2Bi_2PbTi_4O_{15}$, $Bi_2Bi_{2.5}Na_{0.5}Ti_4O_{15}$ and $Bi_2Bi_{2.5}K_{0.5}Ti_4O_{15}$ each corresponding to m=4, and the layered crystal structure oxides represented by the chemical formulas of $Bi_2Bi_2Sr_2Ti_5O_{18}$, $Bi_2Bi_2Ba_2Ti_5O_{18}$ and $Bi_2Bi_2Pb_2Ti_5O_{18}$ each corresponding to m=5.

Further, the present invention can be applied not only to the so-called Aurivillius crystallographic group but also the layered crystal structure oxides represented by the following formula (III) known as superconducting materials:

$$Bi_2Sr_2Ca_{n-1}Cu_nO_{2n+4} \quad (III)$$

$n \leq 4$

This is a so-called Bi base superconducting layered oxide, and the crystal structure thereof has an analogy relationship with the Aurivillius crystallographic group. In particular, the fact that the layers are separated by Bi—O makes them very similar to each other in terms of anisotropy.

Further, in the embodiments and the examples described above, substantially the whole flux has been evaporated in the production of the layered crystal structure oxides, but the evaporation of the flux to such extent that the grown layered crystal structure oxides can be taken out can provide the same effects as in the embodiments and the examples described above.

In addition, in the embodiments and the examples described above, the raw material containing the flux has been heated to a prescribed temperature higher than the melting point in the production of the layered crystal structure oxides to maintain it at the prescribed temperature for fixed time and then slowly cooled at a rate slower than natural cooling to thereby maintain it at temperatures higher than the melting point for prescribed time, whereby substantially the whole flux has been evaporated. In the present invention, however, substantially the whole flux may be evaporated by maintaining the raw material at temperatures higher than the melting point for prescribed time by other methods.

For example, the raw material containing the flux may be maintained at temperatures higher than the melting point for prescribed time by heating the raw material to a prescribed temperature higher than the melting point to maintain it at the prescribed temperature for fixed time, whereby substantially the whole flux may be evaporated. Further, the raw material containing the flux may be heated to a prescribed temperature higher than the melting point and then maintained at temperatures higher than the melting point for prescribed time while leaving it for cooling, whereby substantially the whole flux may be evaporated. In addition, the raw material containing the flux may be heated to a prescribed temperature higher than the melting point and then maintained at temperatures higher than the melting point for prescribed time while slowly cooling it at a rate slower than natural cooling, whereby substantially the whole flux may be evaporated.

As explained above, according to the layered crystal structure oxide of the present invention, the substances showing ferroelectricity or paraelectricity can readily be obtained since at least two elements located at different lattices are partially substituted. Accordingly, provided are the effects that the substances showing ferroelectricity can easily be applied to FeRAM and the substances showing paraelectricity can readily be applied as new substances showing paraelectricity to auxiliary agents for forming capacitors and capacitor materials for DRAMs.

In addition, according to the different layered crystal structure oxide of the present invention, the substances showing ferroelectricity or paraelectricity can readily be obtained as well since at least one element is partially deficient or disordered.

Further, according to the still different layered crystal structure oxide of the present invention, a cation and an anion in the fluorite layer are relatively displaced each other by 3% or more of a unit lattice length in a polarization axis direction, and therefore the substances showing ferroelectricity can readily be obtained. Accordingly, it can be applied to FeRAM.

In addition thereto, according to the production process for a layered crystal structure oxide of the present invention, the flux has been evaporated to such an extent that the layered crystal structure oxide can be taken out by maintaining the raw material containing the flux at temperatures higher than the melting point of the raw material for fixed time, and therefore the grown layered crystal structure oxide can directly be taken out. Accordingly, provided are the effects that an after step for taking out the layered crystal structure oxide is not required and the layered crystal structure oxide can be prevented from being eroded by etching with acid. Further, provided as well is the effect that since a reduction in the flux results in an increase in the melting point, time required for the production can be shortened and therefore the layered crystal structure oxide can efficiently be produced.

What is claimed is:

1. A layered crystal structure oxide comprising bismuth (Bi), oxygen (O), a first element Me comprising at least one element selected from the group consisting of sodium (Na), potassium (K), calcium (Ca), barium (Ba), strontium (Sr), lead (Pb) and bismuth (Bi), and a second element R comprising at least one element selected from the group consisting of iron (Fe), titanium (Ti), vanadium (V), niobium (Nb), tantalum (Ta), tungsten (W) and copper (Cu), wherein the crystal structure oxide having a stoichiometric composition of $(Bi_2O_2)^{2+}Me_{m-1}R_mO_{3m+1})^{2-}$, wherein m is any integer from 2, 3, 4 and 5, wherein the crystal structure having a property selected from the group of properties consisting of at least a part of the bismuth being substituted by one of the other elements constituting the layered crystal structure oxide being substituted; at least a part of at least one element constituting the layered crystal structure oxide being deficient or disordered; and a cation and an anion in a fluorite layer of the crystal structure being relatively displaced by at least 3% of a unit lattice length in a polarization axis direction.

2. A layered crystal structure oxide according to claim 1, wherein the first element is at least one selected from the group consisting of calcium and strontium; and the second element is at least one selected from the group consisting of niobium and tantalum.

3. A layered crystal structure oxide according to claim 1, wherein the first element is strontium, and the second element is tantalum.

4. A layered crystal structure oxide comprising bismuth (Bi), a first element Me comprising at least one element selected from the group consisting of sodium (Na), potassium (K), calcium (Ca), barium (Ba), strontium (Sr), lead (Pb) and bismuth (Bi), a second element R comprising at least one element selected from the group consisting of iron (Fe), titanium (Ti), vanadium (V), niobium (Nb), tantalum (Ta), tungsten (W) and copper (Cu), and oxygen (O), said structure oxide having a stoichmetric composition of $(Bi_2O_2)^{2+}(Me_{m-1}R_mO_{3m+1})^{2-}$ wherein m is any integer from 2, 3, 4 and 5, wherein at least a part of the bismuth is substituted by one of the other elements constituting the layered crystal structure oxide.

5. A layered crystal structure oxide according to claim 4, wherein the other element is selected from the first element Me.

6. The layered crystal structure oxide as described in claim 4, wherein the first element is at least one selected from the group consisting of calcium and strontium; and the second element is at least one selected from the group consisting of niobium and tantalum.

7. The layered crystal structure oxide as described in claim 4, wherein the first element is strontium, and the second element is tantalum.

8. The layered crystal structure oxide as described in claim 4, showing ferroelectricity.

9. The layered crystal structure oxide as described in claim 4, showing paraelectricity.

10. A layered crystal structure oxide comprising bismuth (Bi), a first element Me comprising at least one element selected from the group consisting of sodium (Na), potassium (K), calcium (Ca), barium (Ba), strontium (Sr), lead (Pb) and bismuth (Bi), a second element R comprising a least one element selected from the group consisting of iron (Fe), titanium (Ti), vanadium (V), niobium (Nb), tantalum (Ta), tungsten (W) and copper (Cu), and oxygen (O), said structure oxide having a stoichmetric composition of $(Bi_2O_2)^{2+}(Me_{m-1}R_mO_{3+1})$, wherein m is any integer from 2, 3, 4 and 5, wherein at least a part of at least one element constituting the layered crystal structure oxide is deficient or disordered.

11. The layered crystal structure oxide as described in claim 10, wherein the layered crystal structure oxide contains a fluorite layer, and at least a part of oxygens contained in said fluorite layer is deficient or disordered.

12. The layered crystal structure oxide as described in claim 10, wherein the layered crystal structure oxide contains the fluorite layer and a perovskite layer, and oxygen located at a boundary between said fluorite layer and said perovskite layer is disordered.

13. The layered crystal structure oxide as described in claim 10, wherein the first element is at least one selected from the group consisting of calcium and strontium; and the second element is at least one selected from the group consisting of niobium and tantalum.

14. The layered crystal structure oxide as described in claim 10, wherein the first element is strontium, and the second element is tantalum.

15. The layered crystal structure oxide as described in claim 10, showing ferroelectricity.

16. The layered crystal structure oxide as described in claim 10, showing paraelectricity.

17. A layered crystal structure oxide comprising bismuth (Bi), a first element Me comprising at least one element selected from the group consisting of sodium (Na), potassium (K), calcium (Ca), barium (Ba), strontium (Sr), lead (Pb) and bismuth (Bi), a second element R comprising at least one element selected from the group consisting of iron (Fe), titanium (Ti), vanadium (v), niobium (Nb), tantalum (Ta), tungsten (W) and copper (Cu), and oxygen (O), the layered crystal structure oxide having a stoichmetric composition of $(Bi_2O_2)^{2+}(Me_{m-1}R_mO_{3m+1})^{2-}$ wherein m is selected from 2, 3, 4 and 5, wherein the layered crystal structure oxide contains a fluorite layer, and a cation and an anion in said fluorite layer are relatively displaced by 3% or more of a unit lattace length in a polarization axis direction.

18. The layered crystal structure oxide as described in claim 17, wherein the cation and the anion in said fluorite layer are relatively displaced by 5% or more of the unit lattice length in the polarization axis direction.

19. The layered crystal structure oxide as described in claim 17, wherein the cation and the anion in said fluorite layer are relatively displaced by 7% or more of the unit lattice length in the polarization axis direction.

20. The layered crystal structure oxide as described in claim 17, wherein the first element is at least one selected from the group consisting of calcium and strontium; and the second element is at least one selected from the group consisting of niobium and tantalum.

21. The layered crystal structure oxide as described in claim 17, wherein the first element is strontium, and the second element is tantalum.

22. The layered crystal structure oxide as described in claim 17, showing ferroelectricity.

* * * * *